United States Patent
Kim et al.

(10) Patent No.: US 10,672,694 B2
(45) Date of Patent: Jun. 2, 2020

(54) PRINTED CIRCUIT BOARD, SEMICONDUCTOR PACKAGE INCLUDING THE PRINTED CIRCUIT BOARD, AND METHOD OF MANUFACTURING THE PRINTED CIRCUIT BOARD

(71) Applicant: Samsung Electronics Co., Ltd., Suwon-si, Gyeonggi-do (KR)

(72) Inventors: Dong-suk Kim, Suwon-si (KR); Kyong-soon Cho, Incheon (KR); Shle-ge Lee, Seoul (KR); Yu-duk Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 15/397,970

(22) Filed: Jan. 4, 2017

(65) Prior Publication Data

US 2017/0207155 A1 Jul. 20, 2017

(30) Foreign Application Priority Data

Jan. 18, 2016 (KR) ........................ 10-2016-0005988

(51) Int. Cl.
*H01L 23/498* (2006.01)
*H05K 3/46* (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC . H01L 2224/32225; H01L 2224/48227; H01L 2224/73265; H01L 2924/00;
(Continued)

(56) References Cited

U.S. PATENT DOCUMENTS

| 5,439,732 A | 8/1995 | Nagasaka et al. |
| 7,937,828 B2 | 5/2011 | Yamano |

(Continued)

FOREIGN PATENT DOCUMENTS

| CN | 1777989 A | 5/2006 |
| CN | 1921079 A | 2/2007 |

(Continued)

OTHER PUBLICATIONS

Chinese Office Action dated Jan. 16, 2019 issued in corresponding Chinese Patent Application No. 201710029625.4.

*Primary Examiner* — Bac H Au

(74) *Attorney, Agent, or Firm* — Harness, Dickey & Pierce, P.L.C.

(57) ABSTRACT

A printed circuit board (PCB) reducing a thickness of a semiconductor package and improving reliability of the semiconductor package, a semiconductor package including the PCB, and a method of manufacturing the PCB may be provided. The PCB may include a substrate base having at least one base layer, and a plurality of wiring layers disposed on a top surface and a bottom surface of the at least one base layer, the plurality of wiring layers defining a plurality of wiring patterns, respectively may be provided. An elastic modulus of a conductive material of one wiring pattern of at least one wiring layer from among the plurality of wiring layers may be less than a conductive material of another wiring pattern.

16 Claims, 42 Drawing Sheets

(51) Int. Cl.
*H01L 21/48* (2006.01)
*H01L 25/10* (2006.01)
*H01L 23/00* (2006.01)
*H01L 23/31* (2006.01)
*H01L 25/065* (2006.01)

(52) U.S. Cl.
CPC .. *H01L 23/49827* (2013.01); *H01L 23/49838* (2013.01); *H01L 23/49866* (2013.01); *H05K 3/4652* (2013.01); *H01L 23/3128* (2013.01); *H01L 24/16* (2013.01); *H01L 24/17* (2013.01); *H01L 24/32* (2013.01); *H01L 24/48* (2013.01); *H01L 24/73* (2013.01); *H01L 25/0657* (2013.01); *H01L 25/105* (2013.01); *H01L 2224/16113* (2013.01); *H01L 2224/16225* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2224/83101* (2013.01); *H01L 2225/0651* (2013.01); *H01L 2225/0652* (2013.01); *H01L 2225/06517* (2013.01); *H01L 2225/06572* (2013.01); *H01L 2225/06586* (2013.01); *H01L 2924/00014* (2013.01); *H01L 2924/13091* (2013.01); *H01L 2924/15311* (2013.01); *H01L 2924/15747* (2013.01); *H01L 2924/181* (2013.01); *H01L 2924/18161* (2013.01); *H01L 2924/3511* (2013.01); *H05K 2201/0391* (2013.01); *H05K 2201/09136* (2013.01)

(58) Field of Classification Search
CPC ............... H01L 21/4857; H01L 21/486; H01L 2224/16113; H01L 2224/16227; H01L 2224/48091; H01L 2224/48106; H01L 2225/0651; H01L 2225/0652; H01L 2225/06572; H01L 2225/06586; H01L 23/3128; H01L 23/49822; H01L 23/49827; H01L 23/49838; H01L 23/49866; H01L 24/17; H01L 24/32; H01L 24/48; H01L 24/73; H01L 25/0657
See application file for complete search history.

(56) References Cited

U.S. PATENT DOCUMENTS

| | | | |
|---|---|---|---|
| 8,241,968 B2 | 8/2012 | Lee et al. | |
| 8,604,352 B2 | 12/2013 | Maruyama et al. | |
| 2001/0027874 A1* | 10/2001 | Horiuchi | H01L 23/3735 174/255 |
| 2002/0117743 A1* | 8/2002 | Nakatani | H01L 21/4857 257/687 |
| 2004/0212030 A1* | 10/2004 | Asai | G02B 6/12002 257/432 |
| 2005/0281995 A1* | 12/2005 | Murai | B32B 7/12 428/209 |
| 2006/0202322 A1 | 9/2006 | Kariya et al. | |
| 2007/0170598 A1 | 7/2007 | Iijima et al. | |
| 2009/0289350 A1 | 11/2009 | Watanabe | |
| 2011/0000706 A1* | 1/2011 | Shomura | H05K 3/4602 174/262 |
| 2011/0079418 A1* | 4/2011 | Furuichi | H01L 21/4846 174/257 |
| 2011/0149532 A1 | 6/2011 | Takahashi | |
| 2011/0220396 A1* | 9/2011 | Abe | B82Y 10/00 174/251 |
| 2012/0047731 A1* | 3/2012 | Murakami | H05K 3/4644 29/852 |
| 2013/0093092 A1* | 4/2013 | Kanki | H01L 23/53238 257/758 |
| 2014/0008775 A1 | 1/2014 | Usami et al. | |
| 2015/0357318 A1* | 12/2015 | Chen | H01L 25/50 438/107 |
| 2016/0172265 A1* | 6/2016 | Hashimoto | H01L 23/562 257/690 |
| 2017/0213940 A1* | 7/2017 | Sakai | H01L 33/483 |

FOREIGN PATENT DOCUMENTS

| | | |
|---|---|---|
| CN | 101278393 A | 10/2008 |
| CN | 101983425 A | 3/2011 |
| CN | 102505132 A | 6/2012 |
| JP | 2000012991 A | 1/2000 |
| JP | 2004335934 A | 11/2004 |
| JP | 2013187221 A | 9/2013 |
| KR | 100731604 B1 | 6/2007 |
| KR | 20070077925 A | 7/2007 |
| KR | 20110015958 A | 2/2011 |
| KR | 20110059784 A | 6/2011 |
| KR | 20120082276 A | 7/2012 |
| KR | 20130063360 A | 6/2013 |
| KR | 20140008184 A | 1/2014 |

* cited by examiner

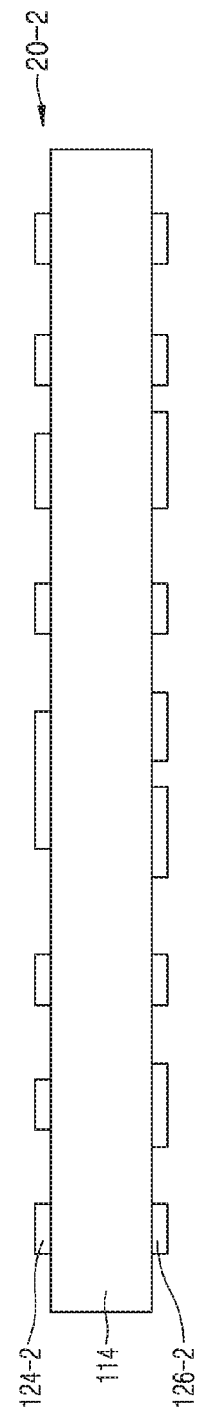

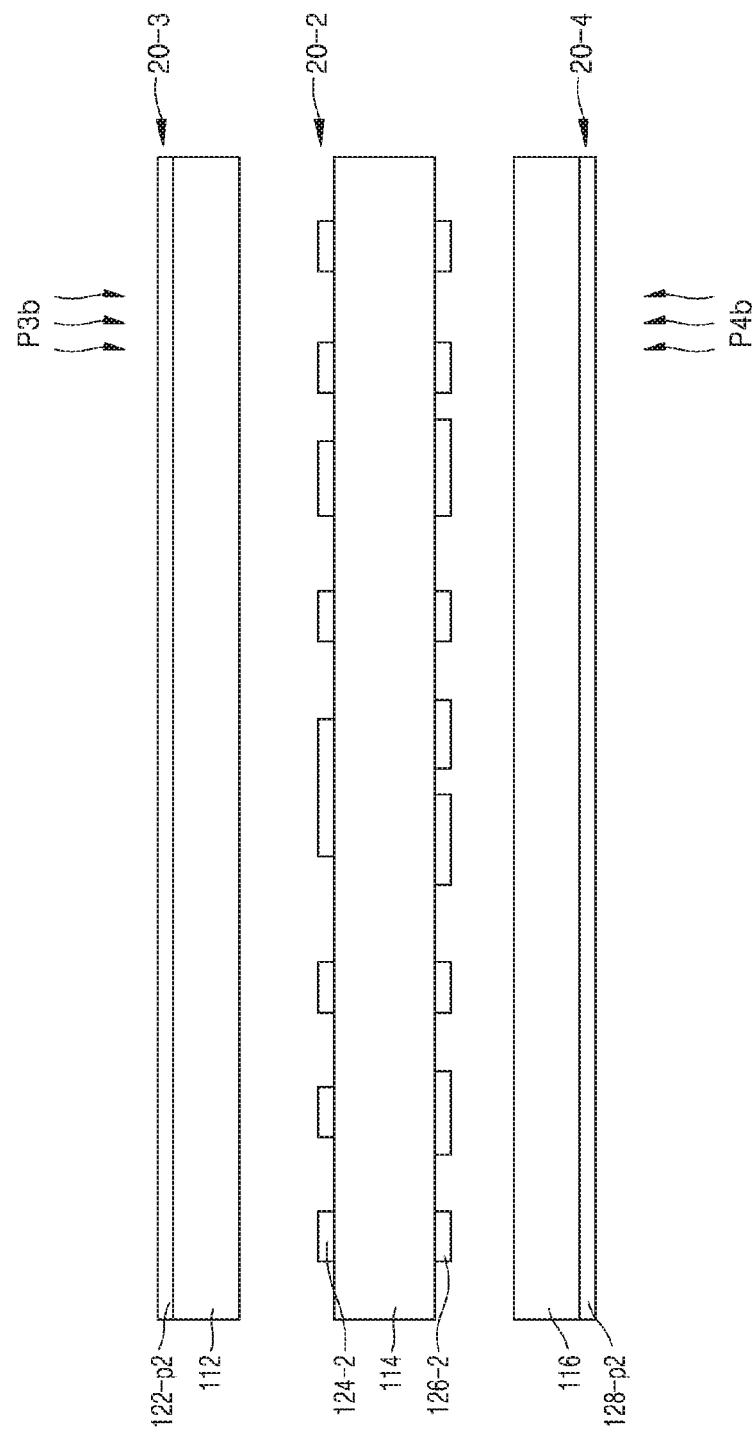

PRINTED CIRCUIT BOARD, SEMICONDUCTOR PACKAGE INCLUDING THE PRINTED CIRCUIT BOARD, AND METHOD OF MANUFACTURING THE PRINTED CIRCUIT BOARD

CROSS-REFERENCE TO RELATED APPLICATION

This application claims under 35 U.S.C. § 119 priority to Korean Patent Application No. 10-2016-0005988, filed on Jan. 18, 2016, in the Korean Intellectual Property Office, the disclosure of which is incorporated herein in its entirety by reference.

BACKGROUND

The inventive concepts relate to printed circuit boards (PCB), semiconductor packages including the PCB, and/or methods of manufacturing the PCB, and more particularly, to PCBs including a plurality of wiring layers, semiconductor packages including the PCB, and/or methods of manufacturing the PCB.

As the electronics industry rapidly develops and demands of users increase, electronic devices are desired to have, for example, more functions and smaller sizes. Accordingly, semiconductor packages included in the electronic devices are also desired to have smaller thicknesses.

SUMMARY

The inventive concepts provide printed circuit boards (PCB) that may reduce a thickness of a semiconductor package and improve reliability of the PCB, semiconductor packages including the PCB, and/or methods of manufacturing the PCB.

According to an example embodiment, a PCB includes a substrate base including at least one base layer, a plurality of wiring layers on a top surface and a bottom surface of the at least one base layer, the plurality of wiring layers defining a plurality of wiring patterns, respectively, an elastic modulus of a conductive material of one wiring pattern from among the plurality of wiring layers being less than a conductive material of another wiring pattern from among the plurality of wiring layers.

According to an example embodiment, a PCB includes a substrate base including at least one base layer, a plurality of wiring layers on a top surface and a bottom surface of the at least one base layer, the plurality of wiring layers defining a plurality of wiring patterns, respectively, a grain size of a metal of one part of the wiring pattern being greater than a grain size of a metal of another part of the wiring pattern.

According to an example embodiment, a semiconductor package includes a printed circuit board (PCB) having a substrate base having at least one base layer and a plurality of wiring layers on a top surface and a bottom surface of the at least one base layer, the plurality of wiring layers defining a plurality of wiring patterns, an elastic modulus of a metal of one wiring pattern from among the plurality of wiring patterns being less than an elastic modulus of a metal of another wiring pattern from among the plurality of wiring patterns, at least one first semiconductor chip attached to a top surface of the PCB and electrically connected to at least a part of the plurality of wiring patterns, and a first mold layer covering at least a part of the top surface of the PCB and the at least one first semiconductor chip.

According to an example embodiment, a method of manufacturing a printed circuit board (PCB) may include forming a first wiring layer, forming a second wiring layer on the first base layer, attaching the first base layer, on which the second wiring layer is formed, to the first wiring layer so that the first base layer faces the first wiring layer. The first wiring layer and the second wiring layer may have different elastic moduli from each other.

According to an example embodiment, a semiconductor package may include a printed circuit board (PCB) having at least one base layer, a plurality of wiring patterns including a first wiring pattern and a second wiring pattern, the first and second wiring patterns on at least one of (1) a top surface and a bottom surface of the at least one base layer, respectively, or (2) a first horizontal region or a second horizontal region of the PCB, respectively, an elastic modulus of the first wiring pattern being different from an elastic modulus of the second wiring pattern, a semiconductor chip attached to a surface of the PCB; and a mold layer covering at least a part of a top surface of the PCB and the semiconductor chip.

BRIEF DESCRIPTION OF THE DRAWINGS

Example embodiments of the inventive concepts will be more clearly understood from the following detailed description taken in conjunction with the accompanying drawings in which:

FIGS. 8A through 8I are cross-sectional views for explaining a method of manufacturing a PCB, according to an example embodiment;

DETAILED DESCRIPTION

The inventive concepts now will be described more fully hereinafter with reference to the accompanying drawings, in which elements of the invention are shown.

Figure 1:
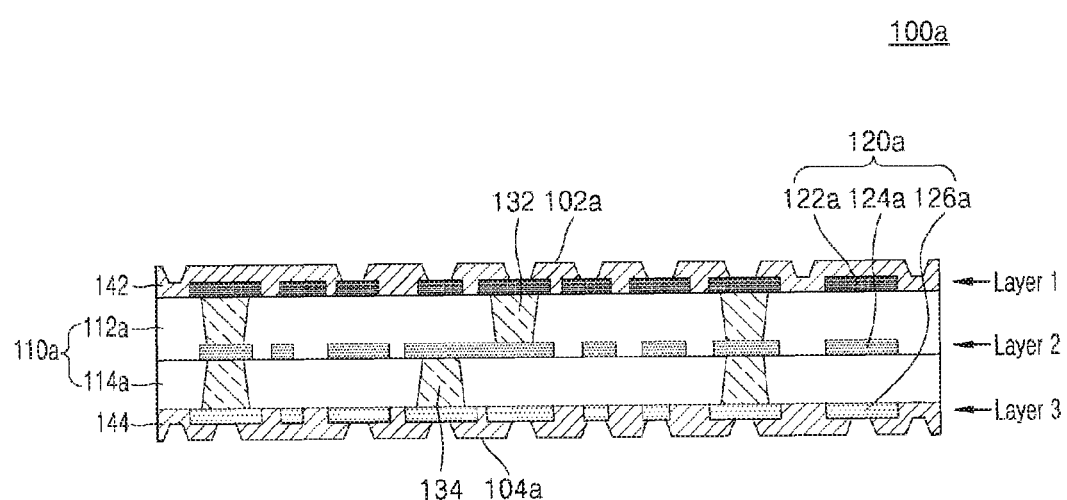
FIG. 1 is a cross-sectional view of a printed circuit board (PCB) according to an example embodiment.

FIG. 1 is a cross-sectional view of a printed circuit board (PCB) 100a according to an example embodiment.

Referring to FIG. 1, the PCB 100a includes a substrate base 110a and a plurality of wiring layers, for example, first through third wiring layers 1, 2, and 3, each having a wiring pattern 120a.

The substrate base 110a may be formed by stacking a plurality of base layers, for example, first and second base layers 112a and 114a.

In some example embodiments, each of the substrate base 110a and the first and second base layers 112a and 114a may be formed of at least one material selected from among phenolic resin, epoxy resin, or polyimide. For example, each of the substrate base 110a and the first and second base layers 112a and 114a may include at least one material selected from among frame retardant 4 (FR4), tetrafunctional epoxy, polyphenylene ether, epoxy/polyphenylene oxide, bismaleimide triazine (BT), thermount, cyanate ester, polyimide, or liquid crystal polymer.

The first through third wiring layers 1, 2, and 3 may be disposed on a top surface and a bottom surface of the first and second base layers 112a and 114a. When the substrate base 110a is formed by stacking the first base layer 112a and the second base layer 114a, the first wiring layer 1 may be disposed on a top surface of the first base layer 112a, the second wiring layer 2 may be disposed between a bottom surface of the first base layer 112a and a top surface of the second base layer 114a, and the third wiring layer 3 may be disposed on a bottom surface of the second base layer 114a.

The term 'wiring layer' used herein refers to a layer with a wiring line that is disposed on a top surface of the substrate base 110a, on a bottom surface of the substrate base 110a, and/or between the first and second base layers 112a and 114a. That is, the number of wiring layers may be one greater than the number of base layers of the substrate base 110a.

In some example embodiments, when the substrate base 110a includes one base layer, two wiring layers may be disposed on the top surface and the bottom surface of the substrate base 110a, and when the substrate base 110a includes three or more base layers, four or more wiring layers may be disposed.

Each of the first through third wiring layers 1, 2, and 3 may have the wiring pattern 120a. Further, the first wiring layer 1 may have a first wiring pattern 122a, the second wiring layer 2 may have a second wiring pattern 124a, and the third wiring layer 3 may have a third wiring pattern 126a.

Each of the first through third wiring patterns 122a, 124a, and 126a may be formed of a conductive material. In some example embodiments, each of the first through third wiring patterns 122a, 124a, and 126a may be formed of a metal.

An elastic modulus of a conductive material of the wiring pattern 120a of at least one wiring layer from among the first through third wiring layers 1, 2, and 3 may be less than an elastic modulus of a conductive material of the wiring pattern 120a of at least one other wiring layer.

A conductive material of the first wiring pattern 122a of the first wiring layer 1, a conductive material of the second wiring pattern 124a of the second wiring layer 2, and a conductive material of the third wiring pattern 126a of the third wiring layer 3 may have a first elastic modulus, a second elastic modulus, and a third elastic modulus, respectively.

In some example embodiments, a first elastic modulus of the conductive material of the first wiring pattern 122a of the first wiring layer 1, a second elastic modulus of the conductive material of the second wiring pattern 124a of the second wiring layer 2, and a third elastic modulus of the conductive material of the third wiring pattern 126a of the third wiring layer 3, may gradually increase from the third wiring layer 3 disposed on the bottom surface of the substrate base 110a to the first wiring layer 1 disposed on the top surface of the substrate base 110a. For example, the first elastic modulus may be greater than the second elastic modulus, and the second elastic modulus may be greater than the third elastic modulus.

In some example embodiments, the first through third wiring patterns 122a, 124a, and 126a of the first through third wiring layers 1, 2, and 3 may include the same metal. Each of the first through third wiring patterns 122a, 124a, and 126a may be formed by using a plating method. For example, the first through third wiring patterns 122a, 124a, and 126a may be formed of copper.

A grain size of a metal of the wiring pattern 120a of at least one wiring layer from among the first through third wiring layers 1, 2, and 3 may be greater than a grain size of a metal of the wiring pattern 120a of at least one other wiring layer.

The term 'grain size' used herein may refer to an average grain size of a metal of a wiring pattern of a wiring layer.

A metal of the first wiring pattern 122a of the first wiring layer 1, a metal of the second wiring pattern 124a of the second wiring layer 2, and a metal of the third wiring pattern 126a of the third wiring layer 3 may have a first grain size, a second grain size, and a third grain size, respectively.

In some example embodiments, a first grain size of the metal of the first wiring pattern 122a, a second grain size of the metal of the second wiring pattern 124a, and a third grain size of the metal of the third wiring pattern 126a may gradually decrease from the third wiring layer 3 disposed on the bottom surface of the substrate base 110a to the first wiring layer disposed on the top surface of the substrate base 110a. For example, the first grain size may be less than the second grain size, and the second grain size may be less than the third grain size.

First and second conductive vias 132 and 134 that electrically connect the first through third wiring patterns 122a, 124a, and 126a may be formed in the substrate base 110a. In some example embodiments, each of the first and second conductive vias 132 and 134 may be formed of copper, nickel, stainless steel, or beryllium copper. The first conductive via 132 may pass through the first base layer 112a and the second conductive via 134 may pass through the second base layer 114a.

A top solder resist layer 142 that covers at least a part of the first wiring pattern 122a may be formed on the top surface of the substrate base 110a. A bottom solder resist layer 144 that covers at least a part of the third wiring pattern 126a may be formed on the bottom surface of the substrate base 110a. A part of the first wiring pattern 122a and a part of the third wiring pattern 126a, which are exposed by not being covered by the top solder resist layer 142 and the bottom solder resist layer 144, may serve as a top pad and a bottom pad of the PCB 100a, respectively. A metal layer (not shown) may be further formed on each of the top pad and the bottom pad. The metal layer may increase an adhesive force of the top pad and the bottom pad and may reduce a contact resistance. For example, the metal layer may be formed by using hot air solder leveling (HASL) or nickel (Ni)/gold (Au) plating.

Each of the top solder resist layer 142 and the bottom solder resist layer 144 may be formed by, for example, applying solder mask insulating ink to the top surface and the bottom surface of the substrate base 110a by using screen printing or inkjet printing and then performing thermal, ultraviolet (UV), or infrared (IR) curing.

The top solder resist layer 142 and the bottom solder resist layer 144 may be formed by, for example, entirely applying a photo-imageable solder resist to the top surface and the bottom surface of the substrate base 110a by using screen printing, spray coating or bonding a film-type solder resist material by using lamination, removing an undesirable portion by using exposure and development, and performing thermal, UV or IR curing.

A semiconductor chip may be attached to a top surface 102a of the PCB 100a. That is, the top surface 102a of the PCB 100a may be a chip attachment surface. An external connection terminal may be attached to a bottom surface 104a of the PCB 100a. That is, the bottom surface 104a of the PCB 100a may be a connection terminal attachment surface. The semiconductor chip may be electrically connected to the top pad. The external connection terminal may be electrically connected to the bottom pad.

A mold layer that covers at least a part of the top surface 102a of the PCB 100a and the semiconductor chip may be formed on the top surface 102a of the PCB 100a.

When a thermal expansion coefficient of a chip structure including the semiconductor chip and the mold layer is different from a thermal expansion coefficient of the PCB on which the chip structure is formed, a semiconductor package, may be warped.

However, in the PCB 100a according to an example embodiment, because an elastic modulus of a conductive material of the wiring pattern 120a of at least one wiring layer from among the first through third wiring layers 1, 2, and 3 is different from an elastic modulus of a conductive material of the wiring pattern 120a of at least one other wiring layer, the warpage of the semiconductor package may be mitigated or prevented.

For example, when a thermal expansion coefficient of the chip structure is less than a thermal expansion coefficient of the PCB, the semiconductor package may be warped into a concave shape.

However, in the PCB 100a according to an example embodiment, because the first elastic modulus of the first wiring pattern 122a is greater than the third elastic modulus of the third wiring pattern 126a, stiffness sufficient to mitigate or prevent the PCB 100a from being warped into a concave shape may be provided and warpage may be offset. Accordingly, the warpage of the semiconductor package including the PCB 100a may be mitigated or prevented.

Figure 2:
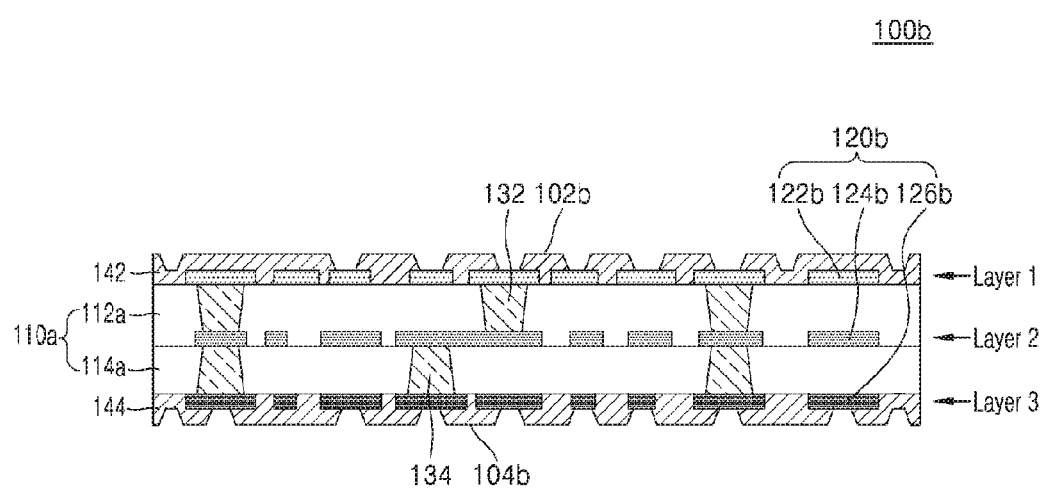
FIG. 2 is a cross-sectional view of a PCB according to an example embodiment.

FIG. 2 is a cross-sectional view of a PCB 100b according to an example embodiment. In FIG. 2, like reference numerals denote the like elements in FIG. 1, and thus, their descriptions will not be repeated.

Referring to FIG. 2, the PCB 100b includes the substrate base 110a, and the first through third wiring layers 1, 2, and 3 each having a wiring pattern 120b.

The substrate base 110a may be formed by stacking the first and second base layers 112a and 114a.

Each of the first through third wiring layers 1, 2, and 3 may have the wiring pattern 120b. For example, the first wiring layer 1 may have a first wiring pattern 122b, the second wiring layer 2 may have a second wiring pattern 124b, and the third wiring layer 3 may have a third wiring pattern 126b.

Each of the first through third wiring patterns 122b, 124b, and 126b may be formed of a conductive material. In some example embodiments, each of the first through third wiring patterns 122b, 124b, and 126b may be formed of a metal.

An elastic modulus of a conductive material of the wiring pattern 120b of at least one wiring layer from among the first through third wiring layers 1, 2, and 3 may be less than an elastic modulus of a conductive material of the wiring pattern 120b of at least one other wiring layer.

A conductive material of the first wiring pattern 122b of the first wiring layer 1, a conductive material of the second wiring pattern 124b of the second wiring layer 2, and a conductive material of the third wiring pattern 126b of the third wiring layer 3 may have a first elastic modulus, a second elastic modulus, and a third elastic modulus, respectively.

In some example embodiments, a first elastic modulus of the conductive material of the first wiring pattern 122b of the first wiring layer 1, a second elastic modulus of the conductive material of the second wiring pattern 124b of the second wiring layer 2, and a third elastic modulus of the conductive material of the third wiring pattern 126b of the third wiring layer 3 may gradually decrease from the third wiring layer 3 disposed on a bottom surface of the substrate base 110a to the first wiring layer 1 disposed on a top surface of the substrate base 110a. For example, the first elastic modulus may be less than the second elastic modulus, and the second elastic modulus may be less than the third elastic modulus.

In some example embodiments, the first through third wiring patterns 122b, 124b, and 126b of the first through third wiring layers 1, 2, and 3 may include the same metal. For example, the first through third wiring patterns 122b, 124b, and 126b may be formed of copper.

A grain size of a metal of the wiring pattern 120b of at least one wiring layer from among the first through third wiring layers 1, 2, and 3 is greater than a grain size of a metal of the wiring pattern 120b of at least one other wiring layer.

A metal of the first wiring pattern 122b of the first wiring layer 1, a metal of the second wiring pattern 124b of the second wiring layer 2, and a metal of the third wiring pattern 126b of the third wiring layer 3 may have a first grain size, a second grain size, and a third grain size, respectively.

In some example embodiments, a first grain size of the metal of the first wiring pattern 122b, a second grain size of the metal of the second wiring pattern 124b, and a third grain size of the metal of the third wiring pattern 126b gradually increase from the third wiring layer 3 disposed on the bottom surface of the substrate base 110a to the first wiring layer 1 disposed on the top surface of the substrate base 110a. For example, the first grain size may be greater than the second grain size, and the second grain size may be greater than the third grain size.

The first and second conductive vias 132 and 134 that electrically connect the first through third wiring patterns 122b, 124b, and 126b may be formed in the substrate base 110a.

The top solder resist layer 142 that covers at least a part of the first wiring pattern 122b may be formed on the top surface of the substrate base 110a. The bottom solder resist layer 144 that covers at least a part of the third wiring pattern 126b may be formed on the bottom surface of the substrate base 110a. A part of the first wiring pattern 122b and a part of the third wiring pattern 126b, which are exposed by not being covered by the top solder resist layer 142 and the bottom solder resist layer 144, may be a top pad and a bottom pad, respectively. A metal layer (not shown) may be further formed on each of the top pad and the bottom pad.

A semiconductor chip may be attached to a top surface 102b of the PCB 100b. That is, the top surface 102b of the PCB 100b may be a chip attachment surface. An external connection terminal may be attached to a bottom surface 104b of the PCB 100b. That is, the bottom surface 104b of the PCB 100b may be a connection terminal attachment surface. The semiconductor chip may be electrically connected to the top pad. The external connection terminal may be electrically connected to the bottom pad.

A mold layer that covers at least a part of the top surface 102b of the PCB 100b and the semiconductor chip may be formed on the top surface 102b of the PCB 100b.

When a thermal expansion coefficient of a chip structure including the semiconductor chip and the mold layer is different from a thermal expansion coefficient of the PCB 100b, on which the chip structure is formed, the semiconductor package may be warped.

However, in the PCB 100b according to an example embodiment, because an elastic modulus of a conductive material of the wiring pattern 120b of at least one wiring layer from among the first through third wiring layers 1, 2, and 3 is different from an elastic modulus of a conductive material of the wiring pattern 120b of at least one other wiring layer, the warpage of the semiconductor package may be mitigated or prevented.

For example, when a thermal expansion coefficient of the chip structure is greater than a thermal expansion coefficient of the PCB, the semiconductor package may be warped into a convex shape.

However, in the PCB 100b according to an example embodiment, because the first elastic modulus is less than the third elastic modulus, stiffness sufficient to prevent the PCB 100b from being warped into a convex shape may be provided and warpage may be offset. Accordingly, the warpage of the semiconductor package including the PCB 100b may be mitigated or prevented.

Figure 3:
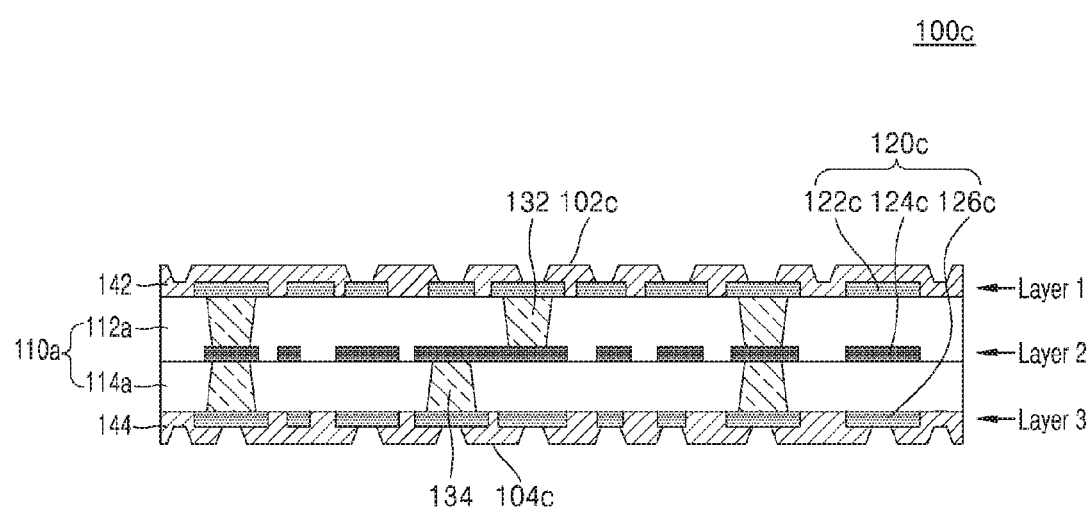
FIG. 3 is a cross-sectional view of a PCB according to an example embodiment.

FIG. 3 is a cross-sectional view of a PCB 100c according to an example embodiment. In FIG. 2, like reference numerals denote the like elements in FIGS. 1 and 2, and thus, their descriptions will not be repeated.

Referring to FIG. 3, the PCB 100c includes the substrate base 110a, and the first through third wiring layers 1, 2, and 3 each having a wiring pattern 120c.

The substrate base 110a may be formed by stacking the first and second base layers 112a and 114a.

Each of the first through third wiring layers 1, 2, and 3 may have the wiring pattern 120c. Further, the first wiring layer 1 may have a first wiring pattern 122c, the second wiring layer 2 may have a second wiring pattern 124c, and the third wiring layer 3 may have a third wiring pattern 126c.

Each of the first through third wiring patterns 122c, 124c, and 126c may be formed of a conductive material. In some example embodiments, each of the first through third wiring patterns 122c, 124c, and 126c may be formed of a metal.

An elastic modulus of a conductive material of the wiring pattern 120c of at least one wiring layer from among the first through third wiring layers 1, 2, and 3 may be different from an elastic modulus of a conductive material of the wiring pattern 120c of at least one other wiring layer.

A conductive material of the first wiring pattern 122c of the first wiring layer 1, a conductive material of the second wiring pattern 124c of the second wiring layer 2, and a conductive material of the third wiring pattern 126c of the third wiring layer 3 may have a first elastic modulus, a second elastic modulus, and a third elastic modulus, respectively.

In some example embodiments, the second wiring pattern 124c of the second wiring layer 2 is disposed in the substrate base 110a. The first wiring patter 112c and the third wiring pattern 126c are disposed on the top surface and the bottom surface of the substrate base 110a, respectively. A second elastic modulus of the conductive material of the second wiring pattern 124c may be greater than a first elastic modulus of the conductive material of the first wiring pattern 122c of the first wiring layer 1 and a third elastic modulus of the conductive material of the third wiring pattern 126c of the third wiring layer 3. For example, the second elastic modulus may be greater than the first elastic modulus and the third elastic modulus. The first elastic modulus and the third elastic modulus may be, but not limited to, the same.

In some example embodiments, the first through third wiring patterns 122c, 124c, and 126c of the first through third wiring layers 1, 2, and 3 may be formed of the same metal. For example, the first through third wiring patterns 122c, 124c, and 126c may be formed of copper.

A grain size of a metal of the wiring pattern 120c of at least one wiring layer from among the first through third wiring layers 1, 2, and 3 may be greater than a grain size of a metal of the wiring pattern 120c of at least one other wiring layer.

A metal of the first wiring pattern 122c of the first wiring layer 1, a metal of the second wiring pattern 124c of the second wiring layer 2, and a metal of the third wiring pattern 126c of the third wiring layer 3 may have a first grain size, a second grain size, and a third grain size, respectively.

In some example embodiments, the second wiring pattern 124c may be disposed in the substrate base 110a. The first wiring pattern 122c and the third wiring pattern 126c may be disposed on the top surface and the bottom surface of the substrate base 110a, respectively. A first grain size of the metal of the second wiring pattern 124c may be less than a second grain size of the metals of the first wiring pattern 122c and a third grain size of the metal of the third wiring pattern 126c. For example, the second grain size may be less than the first grain size and the third grain size. The first grain size and the third grain size may be, but not limited to, the same.

The first and second conductive vias 132 and 134 that electrically connect the first through third wiring patterns 122c, 124c, and 126c may be formed in the substrate base 110a.

The top solder resist layer 142 that covers at least a part of the first wiring pattern 122c may be formed on the top surface of the substrate base 110a. The bottom solder resist layer 144 that covers at least a part of the third wiring pattern 126c may be formed on the bottom surface of the substrate base 110a. A part of the first wiring pattern 122c and a part of the third wiring pattern 126c that are exposed by not being covered by the top solder resist layer 142 and the bottom solder resist layer 144 may be respectively a top pad and a bottom pad of the PCB 100c. A metal layer (not shown) may be further formed on each of the top pad and the bottom pad.

A first semiconductor chip and a second semiconductor chip may be respectively attached to a top surface 102c and a bottom surface 104c of the PCB 100c. That is, the top surface 102c and the bottom surface 104c of the PCB 100c may be chip attachment surfaces. The first semiconductor chip and the second semiconductor chip may be respectively electrically connected to the top pad and the bottom pad.

A first mold layer (not shown) that covers at least a part of the top surface 102c of the PCB 100c and the first semiconductor chip may be formed on the top surface 102c of the PCB 100c. A second mold layer that covers at least a part of the bottom surface 104c of the PCB 100c and the second semiconductor chip may be formed on the bottom surface 104c of the PCB 100c.

When a thermal expansion coefficient of a first chip structure including the first semiconductor chip and the first mold layer and a thermal expansion coefficient of a second chip structure including the second semiconductor chip and the second mold layer are similar to each other and are different from a thermal expansion coefficient of a PCB, stress may be applied to the PCB, and poor contact between the first or second semiconductor chip and the PCB or damage to the PCB may occur.

However, in the PCB 100c according to an example embodiment, because the second elastic modulus is greater than the first elastic modulus and the third elastic modulus, stiffness may be provided to the center of the PCB 100c. Accordingly, the reliability of the semiconductor package including the PCB 100c may be improved.

Figure 4:
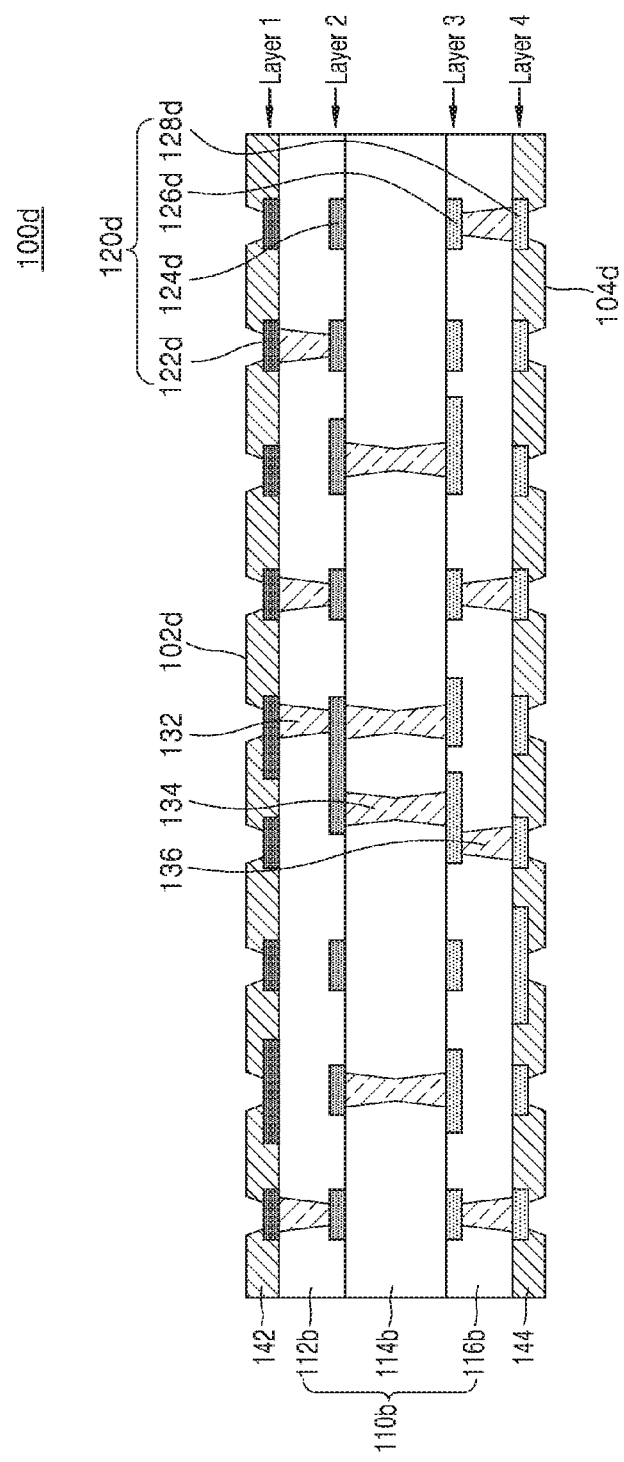
FIG. 4 is a cross-sectional view of a PCB according to an example embodiment.
Figure 5:
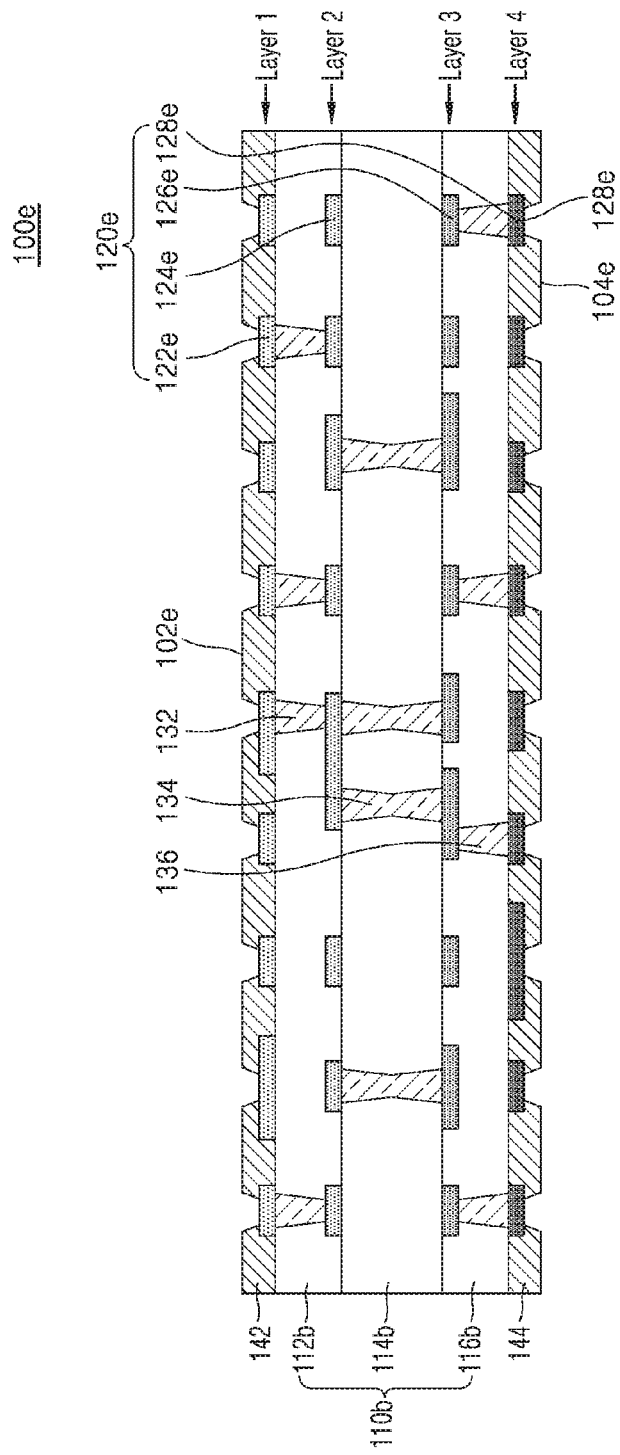
FIG. 5 is a cross-sectional view of a PCB according to an example embodiment.
Figure 6:
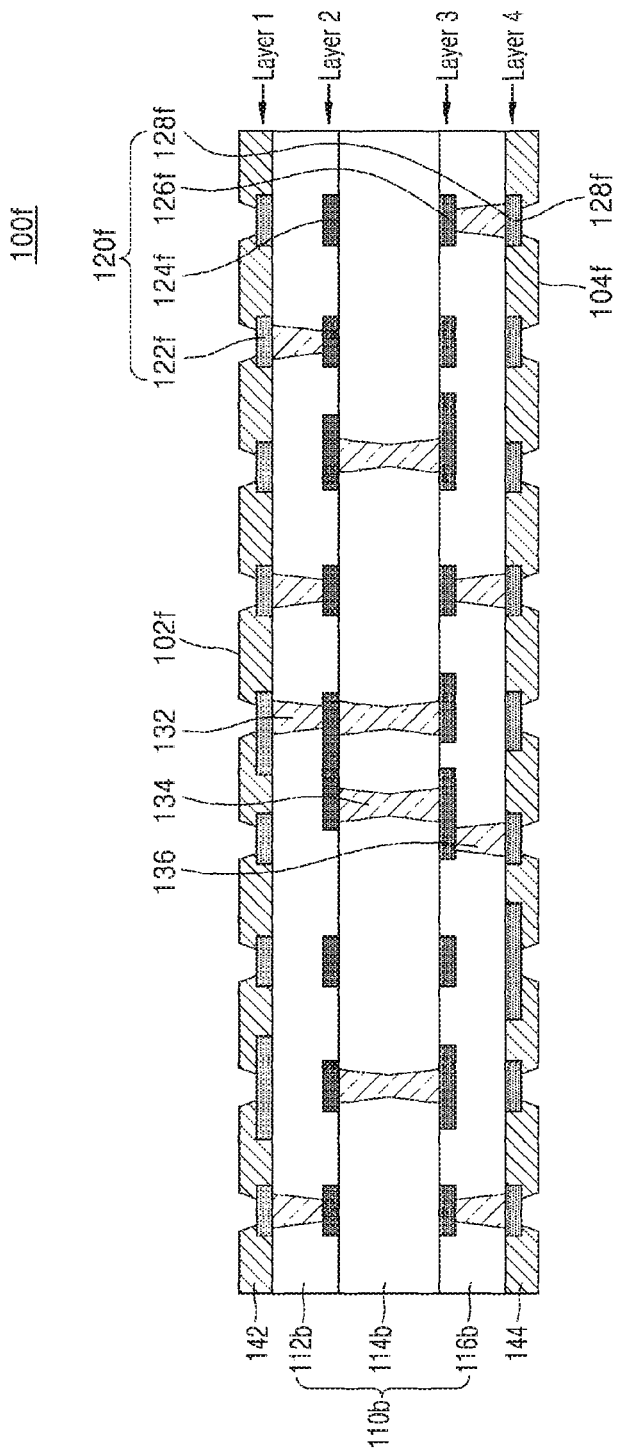
FIG. 6 is a cross-sectional view of a PCB according to an example embodiment.

FIGS. 1 through 3 are cross-sectional views illustrating a case where a PCB includes an odd number of wiring layers, for example, three wiring layers. FIGS. 4 through 6 are cross-sectional views illustrating a case where a PCB includes an even number of wiring layers, for example, four wiring layers. In FIGS. 4 through 6, like reference numerals denote the like elements in FIGS. 1 through 3, and thus, their descriptions will not be repeated.

FIG. 4 is a cross-sectional view of a PCB 100d according to an example embodiment.

Referring to FIG. 4, the PCB 100d includes a substrate base 110b, and a plurality of wiring layers, for example, first through fourth wiring layers 1, 2, 3, and 4, each having a wiring pattern 120d.

The substrate base 110b may be formed by stacking a plurality of base layers, for example, first through third base layers 112b, 114b, and 116b.

The first through fourth wiring layers 1, 2, 3, and 4 may be disposed on a top surface and a bottom surface of the first through third base layers 112b, 114b, and 116b. When the substrate base 110b is formed by stacking the first base layer 112b, the second base layer 114b, and the third base layer 116b, the first wiring layer 1 may be disposed on a top surface of the first base layer 112b, the second wiring layer 2 may be disposed between a bottom surface of the first base layer 112b and a top surface of the second base layer 114b, the third wiring layer 3 may be disposed between a bottom surface of the second base layer 114b and a top surface of the third base layer 116b, and the fourth wiring layer 4 may be disposed on a bottom surface of the third base layer 116b.

Each of the first through fourth wiring layers 1, 2, 3, and 4 may have the wiring pattern 120d. Further, the first wiring layer 1 may have a first wiring pattern 122d, the second wiring layer 2 may have a second wiring pattern 124d, the third wiring layer 3 may have a third wiring pattern 126d, and the fourth wiring layer 4 may have a fourth wiring pattern 128d.

Each of the first through fourth wiring patterns 122d, 124d, 126d, and 128d may be formed of a conductive material. In some example embodiments, each of the first through fourth wiring patterns 122d, 124d, 126d, and 128d may be formed of a metal.

An elastic modulus of a conductive material of the wiring pattern 120d of at least one wiring layer from among the first through fourth wiring layers 1, 2, 3, and 4 may be less than an elastic modulus of a conductive material of the wiring pattern 120d of at least one other wiring layer.

A conductive material of the first wiring pattern 122d of the first wiring layer 1, a conductive material of the second wiring pattern 124d of the second wiring layer 2, a conductive material of the third wiring pattern 126d of the third wiring layer 3, and a conductive material of the fourth wiring pattern 128d of the fourth wiring layer 4 may have a first elastic modulus, a second elastic modulus, a third elastic modulus, and a fourth elastic modulus respectively.

In some example embodiments, a first elastic modulus of the conductive material of the first wiring pattern 122d, a second elastic modulus of the conductive material of the second wiring pattern 124d, a third elastic modulus of the conductive material of the third wiring pattern 126d, and a fourth elastic modulus of the conductive material of the fourth wiring pattern 128d may gradually increase from the fourth wiring layer 4 disposed on a bottom surface of the substrate base 110b to the first wiring layer 1 disposed on a top surface of the substrate base 110b. For example, the first elastic modulus may be greater than the second elastic modulus, the second elastic modulus may be greater than the third elastic modulus, and the third elastic modulus may be greater than the fourth elastic modulus.

In some example embodiments, the first through fourth wiring patterns 122d, 124d, 126d, and 128d of the first through fourth wiring layers 1, 2, 3, and 4 may be formed of the same metal. Each of the first through fourth wiring patterns 122d, 124d, 126d, and 128d may be formed by using a plating method. For example, the first through fourth wiring patterns 122d, 124d, 126d, and 128d may be formed of copper.

A grain size of a metal of the wring pattern 120d of at least one wiring layer from among the first through fourth wiring layers 1, 2, 3, and 4 may be greater than a grain size of a metal of the wiring pattern 120d of at least one other wiring layer.

A metal of the first wiring pattern 122d of the first wiring layer 1, a metal of the second wiring pattern 124d of the second wiring layer 2, a metal of the third wiring pattern 126d of the third wiring layer 3, and the fourth wiring pattern 128d of the fourth wiring layer 4 may have a first grain size, a second grain size, a third grain size, and a fourth grain size, respectively.

In some example embodiments, a first grain size of the metal of the first wiring pattern 122d, a second grain size of the metal of the second wiring pattern 124d, a third grain size of the metal of the third wiring pattern 126d, and a fourth grain size of the metal of the fourth wiring pattern 128d may gradually decrease from the fourth wiring layer 4 disposed on the bottom surface of the substrate base 110b to the first wiring layer 1 disposed on the top surface of the substrate base 110b. For example, the first grain size may be less than the second grain size, the second grain size may be less than the third grain size, and the third grain size may be less than the fourth grain size.

First through third conductive vias 132, 134, and 136 that electrically connect the first through fourth wiring patterns 122*d*, 124*d*, 126*d*, and 128*d* may be formed in the substrate base 110*b*. In some example embodiments, each of the first through third conductive vias 132, 134, and 136 may be formed at least one of copper, nickel, stainless steel, or beryllium copper. The first conductive via 132 may pass through the first base layer 112*b*, the second conductive via 134 may pass through the second base layer 114*b*, and the third conductive via 136 may pass through the third base layer 116*b*.

The top solder resist layer 142 that covers at least a part of the first wiring pattern 122*d* may be formed on the top surface of the substrate base 110*b*. The bottom solder resist layer 144 that covers at least a part of the fourth wiring pattern 128*d* may be formed on the bottom surface of the substrate base 110*b*. A part of the first wiring pattern 122*d* and a part of the fourth wiring pattern 128*d*, which are exposed by not being covered by the top solder resist layer 142 and the bottom solder resist layer 144, may serve as a top pad and a bottom pad respectively. A metal layer (not shown) may be further formed on each of the top pad and the bottom pad.

A semiconductor chip may be attached to a top surface 102*d* of the PCB 100*d*. The top surface 102*d* of the PCB 100*d* may be a chip attachment surface. An external connection terminal may be attached to a bottom surface 104*d* of the PCB 100*d*. That is, the bottom surface 104*d* of the PCB 100*d* may be a connection terminal attachment surface. The semiconductor chip may be electrically connected to the top pad. The external connection terminal may be electrically connected to the bottom pad.

A mold layer that covers at least a part of the top surface 102*d* of the PCB 100*d* and the semiconductor chip may be formed on the top surface 102*d* of the PCB 100*d*.

When a thermal expansion coefficient of a chip structure including the semiconductor chip and the mold layer is different from a thermal expansion coefficient of a PCB, the PCB, on which the chip structure is formed, that is, the semiconductor package, may be warped.

However, in the PCB 100*d* according to an example embodiment, because an elastic modulus of a conductive material of the wiring pattern 120*d* of at least one wiring layer from among the first through fourth wiring layers 1, 2, 3, and 4 is different from an elastic modulus of a conductive material of the wiring pattern 120*d* of at least one other wiring layer, the warpage of the semiconductor package may be mitigated or prevented.

For example, when a thermal expansion coefficient of the chip structure is less than a thermal expansion coefficient of the PCB, the semiconductor package may be warped into a concave shape.

However, in the PCB 100*d* according to an example embodiment, because the first elastic modulus is greater than the fourth elastic modulus, stiffness strong enough to prevent the PCB 100*d* from being warped into a concave shape may be provided and warpage may be offset. Accordingly, the warpage of the semiconductor package including the PCB 100*d* may be mitigated or prevented.

FIG. 5 is a cross-sectional view of a PCB 100*e* according to an example embodiment. In FIG. 5, like reference numerals denote the like elements in FIG. 4, and thus, their descriptions will not be repeated.

Referring to FIG. 5, the PCB 100*e* includes the substrate base 110*b*, and the first through fourth wiring layers 1, 2, 3, and 4 each having a wiring pattern 120*e*.

The substrate base 110*b* may be formed by stacking the first through third base layers 112*b*, 114*b*, and 116*b*.

Each of the first through fourth wiring layers 1, 2, 3, and 4 may have the wiring pattern 120*e*. Further, the first wiring layer 1 may have a first wiring pattern 122*e*, the second wiring layer 2 may have a second wiring pattern 124*e*, the third wiring layer 3 may have a third wiring pattern 126*e*, and the fourth wiring layer 4 may have a fourth wiring pattern 128*e*.

Each of the first through fourth wiring patterns 122*e*, 124*e*, 126*e*, and 128*e* may be formed of a conductive material. In some example embodiments, each of the first through fourth wiring patterns 122*e*, 124*e*, 126*e*, and 128*e* may be formed of a metal.

An elastic modulus of a conductive material of the wiring pattern 120*e* of at least one wiring layer from among the first through fourth wiring layers 1, 2, 3, and 4 may be less than an elastic modulus of a conductive material of the wiring pattern 120*e* of at least one other wiring layer.

Conductive materials of the first wiring pattern 122*e* of the first wiring layer 1, the second wiring pattern 124*e* of the second wiring layer 2, the third wiring pattern 126*e* of the third wiring layer 3, and the fourth wiring pattern 128*e* of the fourth wiring layer 4 may respectively have a first elastic modulus, a second elastic modulus, a third elastic modulus, and a fourth elastic modulus.

In some example embodiments, elastic moduli of conductive materials of the first wiring pattern 122*e*, the second wiring pattern 124*e*, the third wiring pattern 126*e*, and the fourth wiring pattern 128*e* of the first wiring layer 1, the second wiring layer 2, the third wiring layer 3, and the fourth wiring layer 4 may gradually reduce from the fourth wiring layer 4 disposed on a bottom surface of the substrate base 110*b* to the first wiring layer 1 disposed on a top surface of the substrate base 110*b*. For example, the first elastic modulus may be less than the second elastic modulus, the second elastic modulus may be less than the third elastic modulus, and the third elastic modulus may be less than the fourth elastic modulus.

In some example embodiments, each of the first through fourth wiring patterns 122*e*, 124*e*, 126*e*, and 128*e* of the first through fourth wiring layers 1, 2, 3, and 4 may be formed of a metal. For example, the first through fourth wiring patterns 122*e*, 124*e*, 126*e*, and 128*e* may be formed of copper.

A grain size of a metal of the wiring pattern 120*e* of at least one wiring layer from among the first through fourth wiring layers 1, 2, 3, and 4 may be greater than a grain size of a metal of the wiring pattern 120*e* of at least one other wiring layer.

A metal of the first wiring pattern 122*e* of the first wiring layer 1, a metal of the second wiring pattern 124*e* of the second wiring layer 2, a metal of the third wiring pattern 126*e* of the third wiring layer 3, and a metal of the fourth wiring pattern 128*e* of the fourth wiring layer 4 may respectively have a first grain size, a second grain size, a third grain size, and a fourth grain size.

In some example embodiments, a first grain size of the metal of the first wiring pattern 122*e*, a second grain size of the metal of the second wiring pattern 124*e*, a third grain size of the metal of the third wiring pattern 126*e*, and a fourth grain size of the metal of the fourth wiring pattern 128*e* may gradually increase from the fourth wiring layer 4 disposed on the bottom surface of the substrate base 110*b* to the first wiring layer 1 disposed on the top surface of the substrate base 110*b*. For example, the first grain size may be greater than the second grain size, the second grain size may be greater than the third grain size, and the third grain size may be greater than the fourth grain size.

The first through third conductive vias 132, 134, and 136 that electrically connect the first through fourth wiring patterns 122e, 124e, 126e, and 128e may be formed in the substrate base 110b.

The top solder resist layer 142 that covers at least a part of the first wiring pattern 122e may be formed on the top surface of the substrate base 110b. The bottom solder resist layer 144 that covers at least a part of the fourth wiring pattern 128e may be formed on the bottom surface of the substrate base 110b. A part of the first wiring pattern 122e and a part of the fourth wiring pattern 128e that are exposed by not being covered by the top solder resist layer 142 and the bottom solder resist layer 144 may be respectively a top pad and a bottom pad. A metal layer (not shown) may be further formed on each of the top pad and the bottom pad.

A semiconductor chip may be attached to a top surface 102e of the PCB 100e. That is, the top surface 102e of the PCB 100e may be a chip attachment surface. An external connection terminal may be attached to a bottom surface 104e of the PCB 100e. That is, the bottom surface 104e of the PCB 100e may be a connection terminal attachment surface. The semiconductor chip may be electrically connected to the top pad. The external connection terminal may be electrically connected to the bottom pad.

A mold layer that covers at least a part of the top surface 102e of the PCB 100e and the semiconductor chip may be formed on the top surface 102e of the PCB 100e.

When a thermal expansion coefficient of a chip structure including the semiconductor chip and the mold layer is different from a thermal expansion coefficient of a PCB, the PCB, on which the chip structure is formed, that is, the semiconductor package, may be warped.

However, in the PCB 100e according to an example embodiment, because an elastic modulus of a conductive material of the wiring pattern 120e of at least one wiring layer from among the first through fourth wiring layers 1, 2, 3, and 4 is different from an elastic modulus of a conductive material of the wiring pattern 120e of at least one other wiring layer, the warpage of the semiconductor package may be mitigated or prevented.

For example, when a thermal expansion coefficient of the chip structure is greater than a thermal expansion coefficient of the PCB, the semiconductor package may be warped into a convex shape.

However, in the PCB 100e according to an example embodiment, because the first elastic modulus is less than the fourth elastic modulus, stiffness strong enough to prevent the PCB 100e from being warped into a convex shape may be provided and warpage may be offset. Accordingly, the warpage of the semiconductor package including the PCB 100e may be mitigated or prevented.

FIG. 6 is a cross-sectional view of a PCB 100f according to an example embodiment. In FIG. 6, like reference numerals denote the like elements in FIGS. 4 and 5, and thus, their descriptions will not be repeated.

Referring to FIG. 6, the PCB 100f includes the substrate base 110b, and the first through fourth wiring layers 1, 2, 3, and 4 each having a wiring pattern 120f.

The substrate base 110b may be formed by stacking the first through third base layers 112b, 114b, and 116b.

Each of the first through fourth wiring layers 1, 2, 3, and 4 may have the wiring pattern 120f. Further, the first wiring layer 1 may have a first wiring pattern 122f, the second wiring pattern 124f, the third wiring layer 3 may have a third wiring pattern 126f, and the fourth wiring layer 4 may have a fourth wiring pattern 128f.

Each of the first through fourth wiring patterns 122f, 124f, 126f, and 128f may be formed of a conductive material. In some example embodiments, each of the first through fourth wiring patterns 122f, 124f, 126f, and 128f may be formed of a metal.

An elastic modulus of a conductive material of the wiring pattern 120f of at least one wiring layer from among the first through fourth wiring layers 1, 2, 3, and 4 may be less than an elastic modulus of a conductive material of the wiring pattern 120f of at least one other wiring layer.

Conductive materials of the first wiring pattern 122f of the first wiring layer 1, the second wiring pattern 124f of the second wiring layer 2, the third wiring pattern 126f of the third wiring layer 3, and the fourth wiring pattern 128f of the fourth wiring layer 4 may respectively have a first elastic modulus, a second elastic modulus, a third elastic modulus, and a fourth elastic modulus.

In some example embodiments, elastic moduli of conductive materials of the second wiring pattern 124f and the third wiring pattern 126f of the second wiring layer 2 and the third wiring layer 3 that are disposed in the substrate base 110b may be greater than elastic moduli of conductive materials of the first wiring pattern 122f and the fourth wiring pattern 128f of the first wiring layer 1 and the fourth wiring layer 4 that are respectively disposed on a top surface and a bottom surface of the substrate base 110b. For example, the second elastic modulus and the third elastic modulus may be greater than the first elastic modulus and the fourth elastic modulus. The first elastic modulus and the fourth elastic modulus may be, but not limited to, the same, and the second elastic modulus and the third elastic modulus may be, but not limited to, the same.

In some example embodiments, the first through fourth wiring patterns 122f, 124f, 126f, and 128f of the first through fourth wiring layers 1, 2, 3, and 4 may be formed of the same metal. For example, the first through fourth wiring patterns 122f, 124f, 126f, and 128f may be formed of copper.

A grain size of a metal of the wiring pattern 120f of at least one wiring layer from among the first through fourth wiring layers 1, 2, 3, and 4 may be greater than a grain size of a metal of the wiring pattern 120f of at least one other wiring layer.

A metal of the first wiring pattern 122f of the first wiring layer 1, a metal of the second wiring pattern 124f of the second wiring layer 2, a metal of the third wiring pattern 126f of the third wiring layer 3, and a metal of the fourth wiring pattern 128f of the fourth wiring layer 4 may have a first grain size, a second grain size, a third grain size, and a fourth grain size, respectively.

In some example embodiments, the second wiring pattern 124f and the third wiring pattern 126f may be disposed in the substrate base 110b. The first wiring pattern 122f and the fourth wiring pattern 128f may be disposed on the top surface and the bottom surface of the substrate base 110b, respectively. A first grain size of the metal of the second wiring pattern 124f and a third grain size of the third wiring pattern 126f may be less than a first grain size of the metal of the first wiring pattern 122f and a fourth grain size of the fourth wiring pattern 128f. For example, the second grain size and the third grain size may be less than the first grain size and the fourth grain size. The first grain size and the fourth grain size may be, but not limited to, the same. The second grain size and the third grain size may be, but not limited to, the same.

The first through third conductive vias 132, 134, and 136 that electrically connect the first through fourth wiring patterns 122f, 124f, 126f, and 128f may be formed in the substrate base 110b.

The top solder resist layer 142 that covers at least a part of the first wiring pattern 122f may be formed on the top surface of the substrate base 110b. The bottom solder resist layer 144 that covers at least a part of the fourth wiring pattern 128f may be formed on the bottom surface of the substrate base 110b. A part of the first wiring pattern 122f and a part of the fourth wiring pattern 128f that are exposed by not being covered by the top solder resist layer 142 and the bottom solder resist layer 144 may be respectively a top pad and a bottom pad. A metal layer (not shown) may be further formed on each of the top pad and the bottom pad.

A first semiconductor chip and a second semiconductor chip may be respectively attached to a top surface 102f and a bottom surface 104f of the PCB 100f. That is, the top surface 102f and the bottom surface 104f of the PCB 100f may be chip attachment surfaces. The first semiconductor chip and the second semiconductor chip may be respectively electrically connected to the top pad and the bottom pad.

A first mold layer that covers at least a part of the top surface 102f of the PCB 100f and the first semiconductor chip may be formed on the top surface 102f of the PCB 100f. A second mold layer that covers at least a part of the bottom surface 104f of the PCB 100f and the second semiconductor chip may be formed on the bottom surface 104f of the PCB 100f.

When a thermal expansion coefficient of a first chip structure including the first semiconductor chip and the first mold layer and a thermal expansion coefficient of a second chip structure including the second semiconductor chip and the second mold layer are similar to each other and are different from a thermal expansion coefficient of a PCB, stress may be applied to the PCB and thus poor contact between the first or second semiconductor chip and the PCB or damage to the PCB may occur.

However, in the PCB 100f according to an example embodiment, because the second elastic modulus and the third elastic modulus are greater than the first elastic modulus and the fourth elastic modulus, stiffness may be provided to the center of the PCB 100f. Accordingly, the reliability of the semiconductor package including the PCB 100f may be improved.

FIGS. 7A through 8I are cross-sectional views for explaining a method of manufacturing a PCB, according to an example embodiment. In FIGS. 7A through 8I, a method of forming the first and second conductive vias 132 and 134 of FIGS. 1 through 3 and a method of forming the first through third conductive vias 132, 134, and 136 of FIGS. 4 through 6 are well known to one of ordinary skill in the art, and thus an explanation thereof will not be given.

FIGS. 7A through 7I are cross-sectional views for explaining a method of manufacturing a PCB, according to an example embodiment.

Figure 7A:
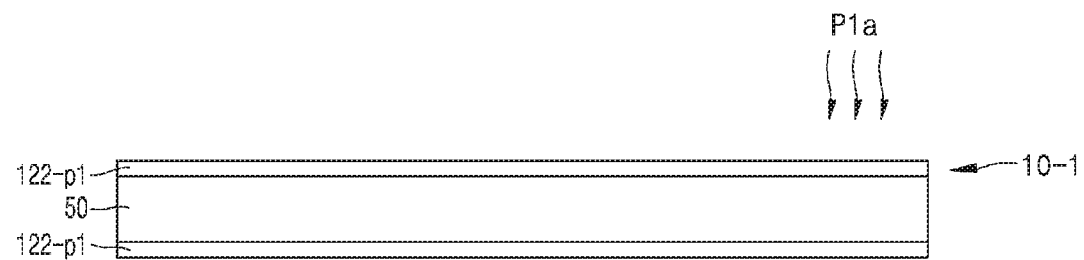
FIGS. 7A through 7I are cross-sectional views for explaining a method of manufacturing a PCB, according to an example embodiment.

Referring to FIG. 7A, a detach core layer 50 is prepared. Next, a first pre-structure 10-1 in which first wiring layers 122-p1 are formed on a top surface and a bottom surface of the detach core layer 50 is prepared by performing a first plating method P1a on the top surface and the bottom surface of the detach core layer 50. For example, the first wiring layers 122-p1 may be formed of copper.

The first plating method P1a may be performed by applying current at a first current density by using a plating solution containing a first amount of additive. The term 'amount of additive' used herein may refer to a volume ratio of an additive contained in a plating solution.

The additive may be at least one of, for example, a leveller for levelling a plating layer, a grain refiner for refining particles of the plating layer, a stress reducer for reducing stress in the plating layer during plating, or a wetting agent for helping plating elements to be attached to a surface of a cathode.

Figure 7B:
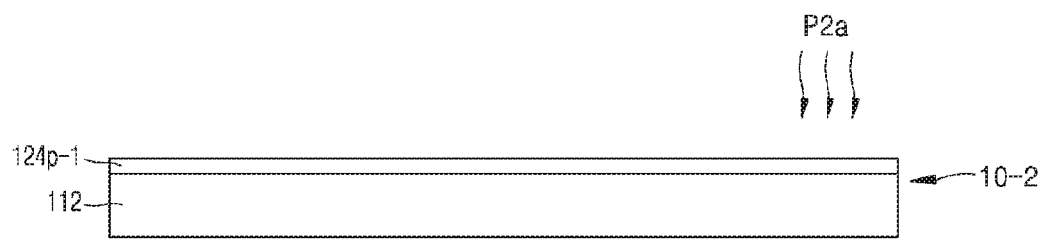
Figure 7B:
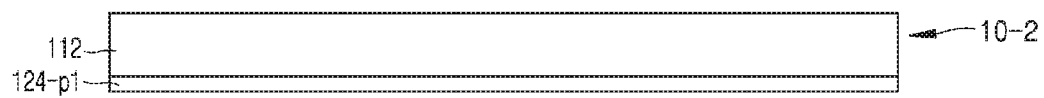

Referring to FIG. 7B, a first base layer 112 is prepared. Next, a second pre-structure 10-2 in which a second wiring layer 124-p1 is formed on one surface of the first base layer 112 is prepared by performing a second plating method P2a on the one surface of the first base layer 112. For example, the second wiring layer 124-p1 may be formed of copper.

The second plating method P2a may be performed by applying current at a second current density by using a plating solution containing a second amount of additive.

Figure 7C:
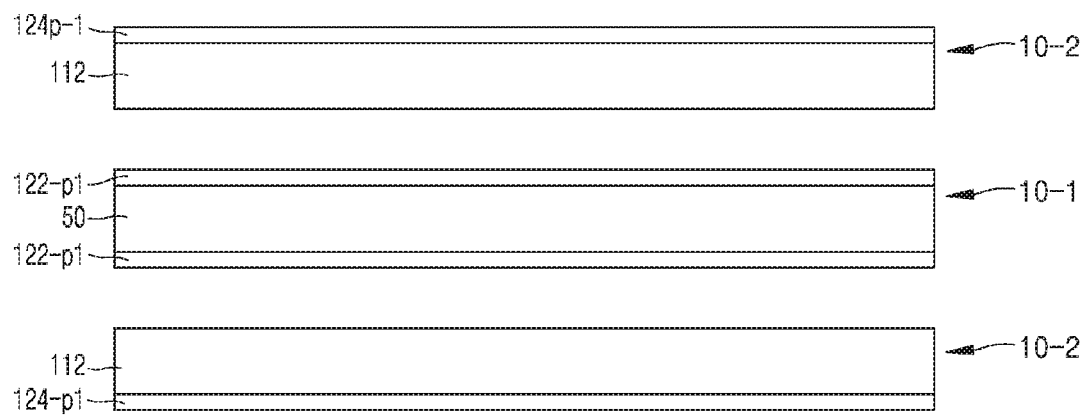

Referring to FIG. 7C, two second pre-structures 10-2 are prepared for one first pre-structure 10-1. The second pre-structures 10-2 may be respectively attached to both surfaces of the first pre-structure 10-1.

Figure 7D:
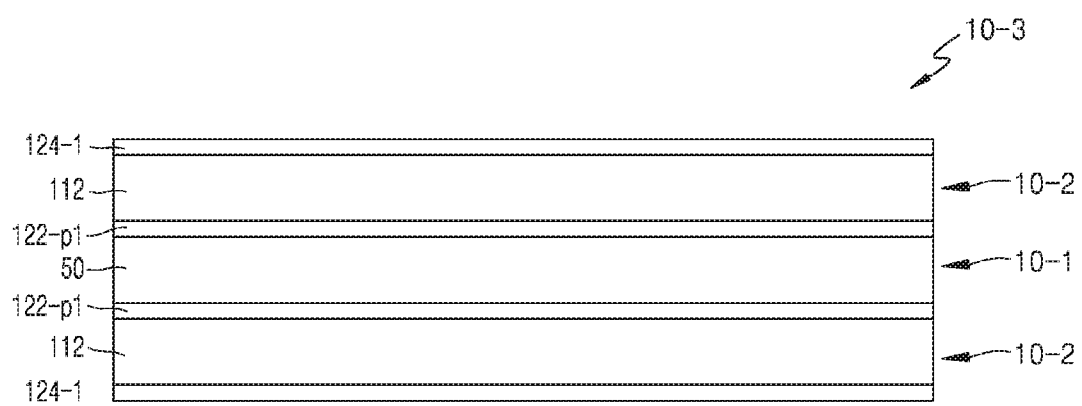

Referring to FIG. 7D, the second pre-structures 10-2 are respectively attached to the both surfaces of the first pre-structure 10-1. A third pre-structure 10-3 is prepared by respectively attaching the second pre-structures 10-2 to the both surfaces of the first pre-structure 10-2 so that the first base layers 112 of the second pre-structures 10-2 face the first pre-structure 10-1.

Figure 7E:
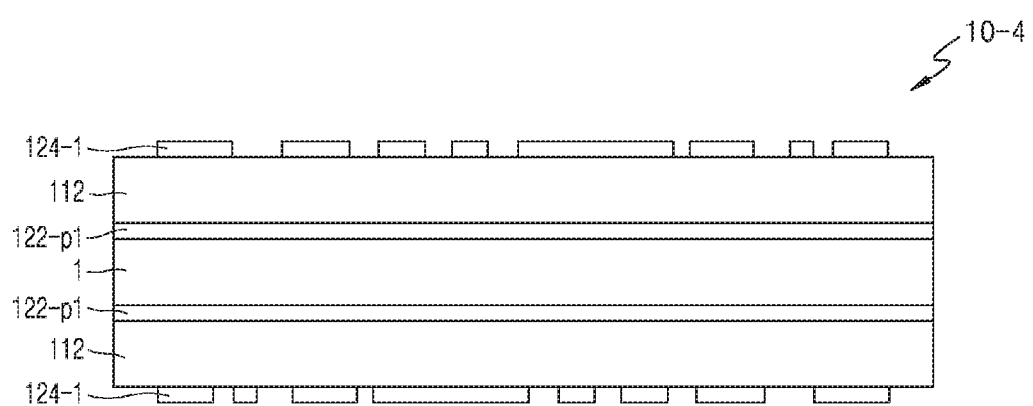

Referring to FIGS. 7D and 7E, a fourth pre-structure 10-4 is prepared by patterning the second wiring layers 124-p1, which are disposed on both surfaces of the third pre-structure 10-3 by using an etching process to form second wiring patterns 124-1.

Figure 7F:
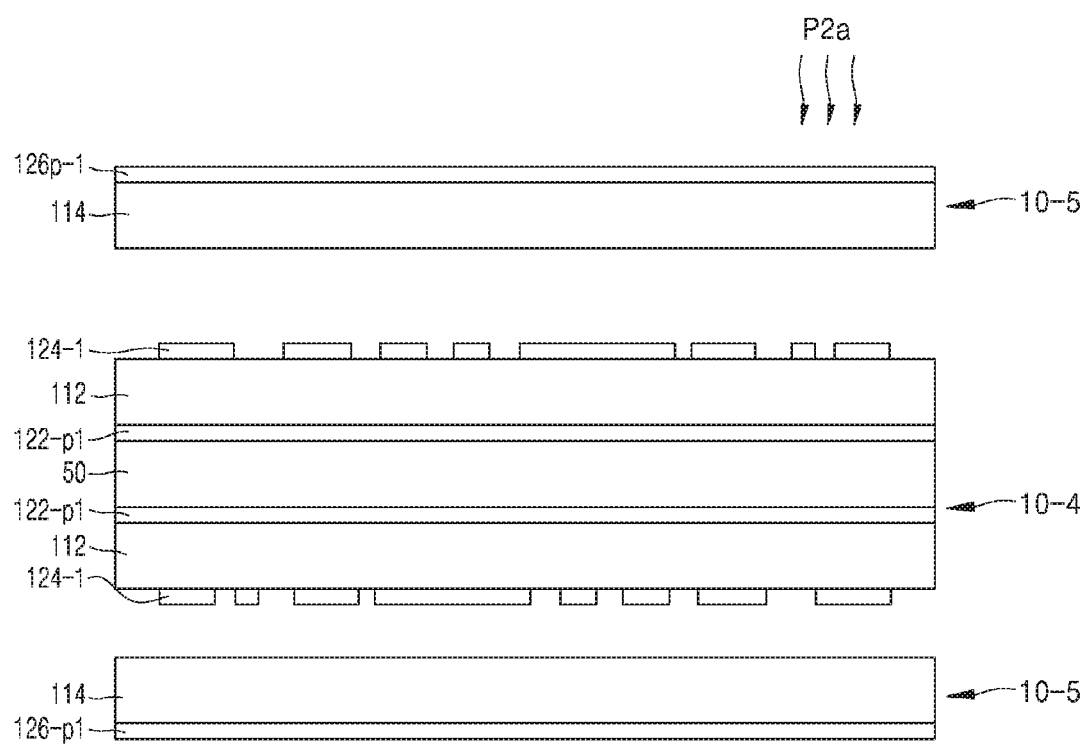

Referring to FIG. 7F, a second base layer 114 is prepared. Next, a fifth pre-structure 10-5, in which a third wiring layer 126-p1 is formed on one surface of the second base layer 114, is prepared by performing a third plating method P3a on the one surface of the second base layer 114. For example, the third wiring layer 126-p1 may be formed of copper.

The third plating method P3a may be performed by applying current at a third current density by using a plating solution containing a third amount of additive.

Next, two fifth pre-structures 10-5 are prepared for one fourth pre-structure 10-4. The fifth pre-structures 10-5 may be respectively attached to both surfaces of the fourth pre-structure 10-4.

Figure 7G:
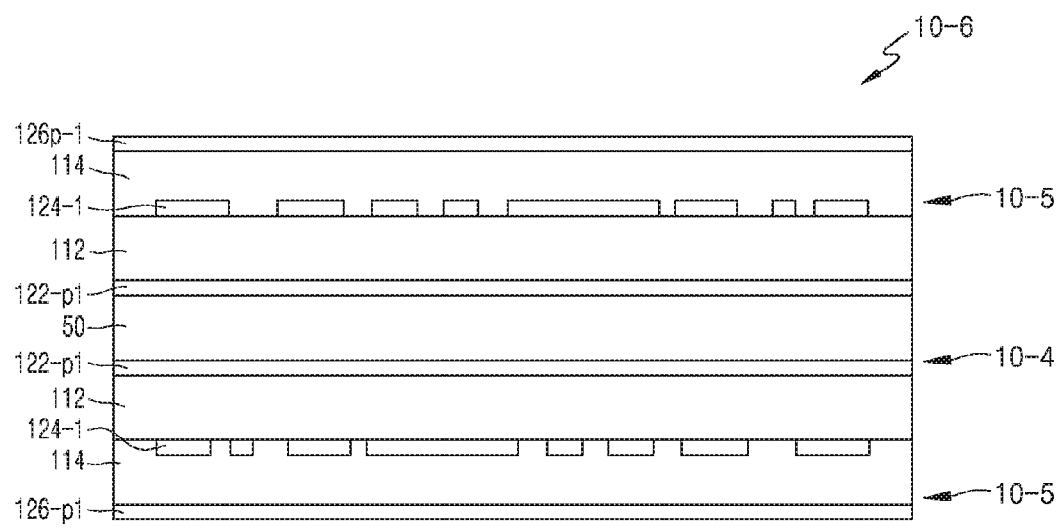

Referring to FIG. 7G, the fifth pre-structures 10-5 are respectively attached to the both surfaces of the fourth pre-structure 10-4. A sixth pre-structure 10-6 is prepared by attaching the fifth pre-structures 10-5 to the both surfaces of the fourth pre-structure 10-4 so that the second base layers 114 of the fifth pre-structures 10-5 face the fourth pre-structure 10-4.

Figure 7H:
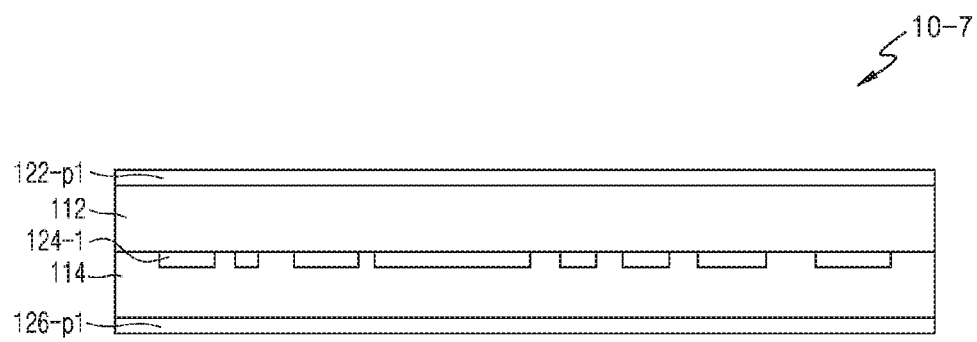

Referring to FIGS. 7G and 7H, a seventh pre-structure 10-7 is formed by removing a part of the sixth pre-structure 10-6 (e.g., removing the detach core layer 50).

In the seventh structure 10-7, the second wiring pattern 124-1 may be disposed between the first and second base layers 112 and 114 and the first wiring layer 122-p1 and the third wiring layer 126-p1 may be respectively disposed on a top surface of the first base layer 112 and a bottom surface of the second base layer 114.

Figure 7I:
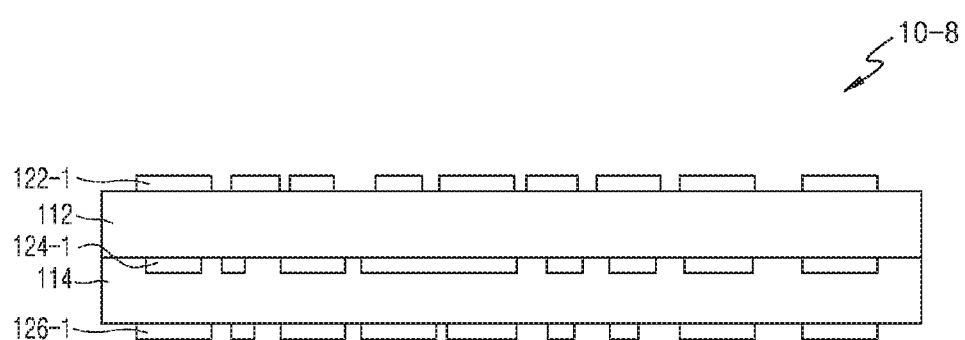

Referring to FIGS. 7H and 7I, a pre-PCB 10-8 including a first wiring pattern 122-1 and a third wiring pattern 126-1 is prepared by patterning the first wiring layer 122-p1 and the third wiring layer 126-*p*1 respectively disposed on both surfaces of the seventh pre-structure 10-7 by using an etching process.

Next, as shown in FIGS. 1 through 3, the PCBs 100*a*, 100*b*, and 100*c* may be formed by respectively forming the top solder resist layer 142 and the bottom solder resist layer 144 on the top surface and the bottom surface of the pre-PCB 10-8.

Although a method of forming a PCB including three wiring layers having the first through third wiring patterns 122-1, 124-1, and 126-1 has been explained in FIGS. 7A through 7I, it will be understood by one of ordinary skill that the PCB 100*d*, 100*e*, or 100*f* including four wiring layers as shown in FIGS. 4 through 6 may be formed in a like manner.

Referring to FIGS. 7A through 7I, while the first plating method P1*a*, the second plating method P2*a*, and the third plating method P3*a* are performed, elastic moduli and grain sizes of the first through third wiring patterns 122-1, 124-1, and 126-1 may be made different from one another by adjusting the first amount and/or the first current density, the second amount and/or the second current density, or the third amount and/or the third current density.

In some example embodiments, a wiring pattern formed by using a plating method with a relatively large current density may have a large elastic modulus and/or a small grain size. Also, a wiring pattern formed by using a plating method with a relatively small current density may have a small elastic modulus and/or a large grain size.

Accordingly, elastic moduli and grain sizes of the first through third wiring patterns 122-1, 124-1, and 126-1 may be made different from one another by making different at least one of the first through third amounts or the first through third current densities in the first through third plating methods P1*a*, P2*a*, and P3*a*.

FIGS. 8A through 8I are cross-sectional views for explaining a method of manufacturing a PCB, according to an example embodiment.

Figure 8A:
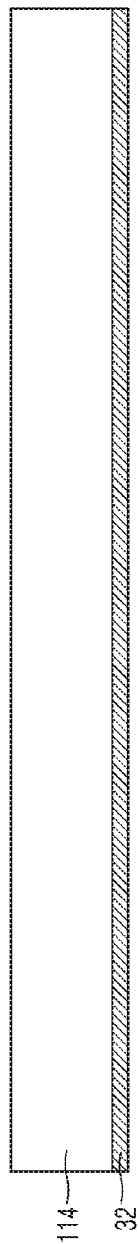

Referring to FIG. 8A, the second base layer 114 is prepared. Next, a first mask layer 32 that covers one surface, for example, a bottom surface, of the second base layer 114 is formed. The first mask layer 32 may be, for example, a photoresist layer.

Figure 8B:
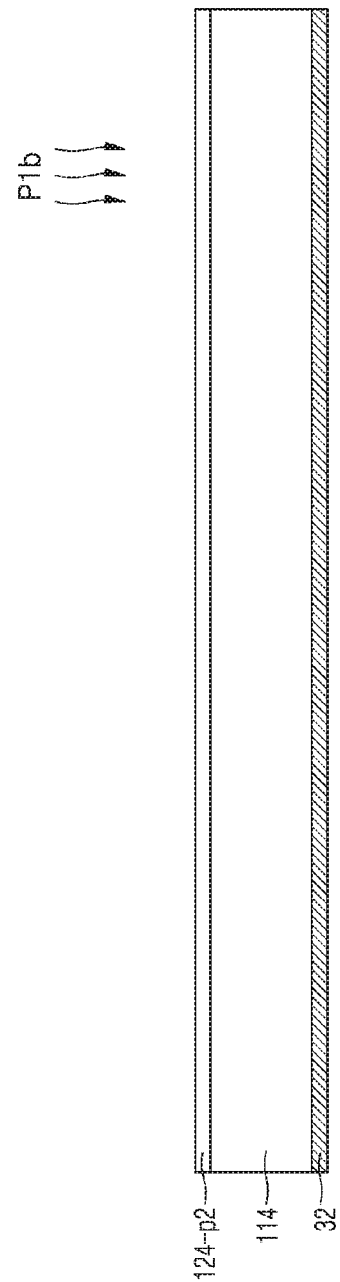

Referring to FIG. 8B, a second wiring layer 124-*p*2 is formed on the other surface, for example, a top surface, of the second base layer 114 that is not covered by the first mask layer 32 by performing a first plating method P1*b* on the top surface of the second base layer 114. For example, the second wiring layer 124-*p*2 may be formed of copper.

The first plating method P1*b* may be performed by applying current at a first current density by using a plating solution containing a first amount of additive.

After the second wiring layer 124-*p*2 is formed, the first mask layer 32 is removed.

Figure 8C:
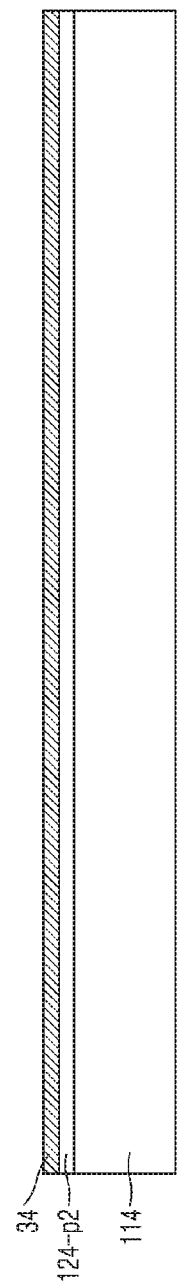

Referring to FIG. 8C, a second mask layer 34 that covers the second wiring layer 124-*p*2 formed on the top surface of the second base layer 114 is formed. The second mask layer 34 may be, for example, a photoresist layer.

Figure 8D:
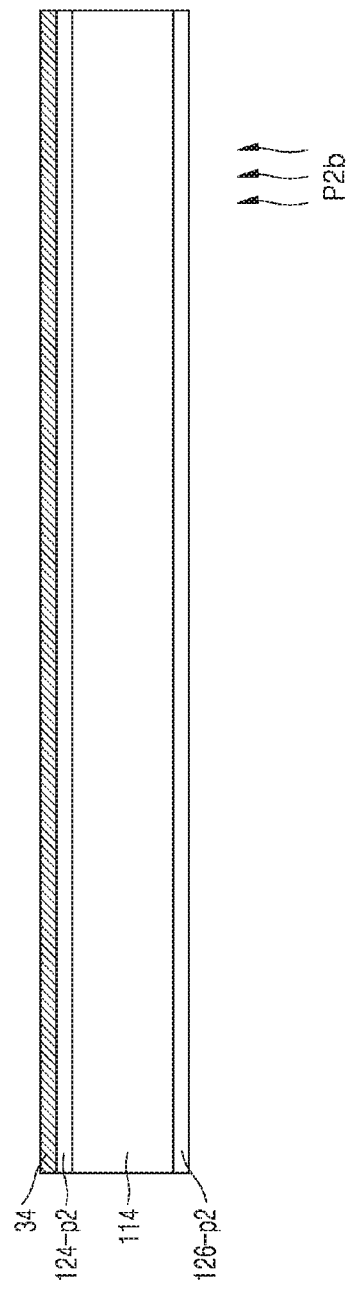

Referring to FIG. 8D, a third wiring layer 126-*p*2 is formed on the bottom surface of the second base layer 114 by performing a second plating method P2*b* on one surface, for example, the bottom surface, of the second base layer 114 that is not covered by the second mask layer 34. For example, the third wiring layer 126-*p*2 may be formed of copper.

The second plating method P2*b* may be performed by applying current at a second current density by using a plating solution containing a second amount of additive.

Figure 8E:
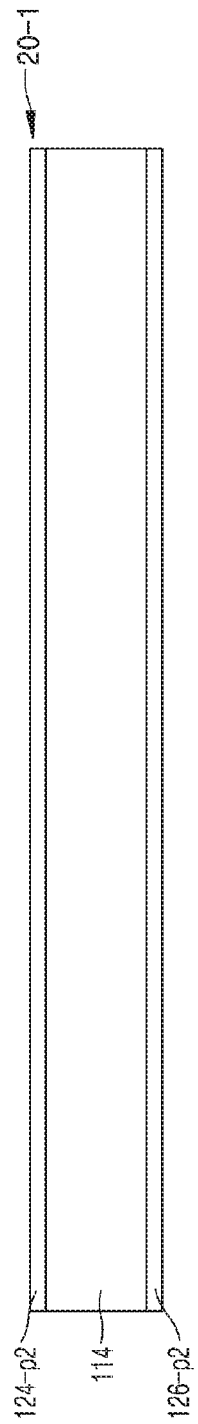

Referring to FIG. 8E, after the third wiring layer 126-*p*2 is formed, a first pre-structure 20-1, in which the second wiring layer 124-*p*2 and the third wiring layer 126-*p*2 are respectively formed on the top surface and the bottom surface of the second base layer 114, is prepared by removing the second mask layer 34 (see FIG. 8D).

Referring to FIGS. 8E and 8F, a second pre-structure 20-2 is prepared by patterning the second wiring layer 124-*p*2 and the third wiring layer 126-*p*2, which are disposed on both surfaces of the first pre-structure 20-1, respectively, by using an etching process to form a second wiring pattern 124-2 and a third wiring pattern 126-2.

Referring to FIG. 8G, the first base layer 112 and a third base layer 116 are prepared.

A third pre-structure 20-3, in which a first wiring layer 122-*p*2 is formed on one surface of the first base layer 112, is prepared by performing a third plating method P3*b* on the one surface of the first base layer 112. For example, the first wiring layer 122-*p*2 may be formed of copper.

The third plating method P3*b* may be performed by applying current at a third current density by using a plating solution containing a third amount of additive.

Also, a fourth pre-structure 20-4, in which a fourth wiring layer 128-*p*2 is formed on one surface of the third base layer 116, is prepared by performing a fourth plating method P4*b* on the one surface of the third base layer 116. For example, the fourth wiring layer 128-*p*2 may be formed of copper.

The fourth plating method P4*b* may be performed by applying current at a fourth current density by using a plating solution containing a fourth amount of additive.

Figure 8H:
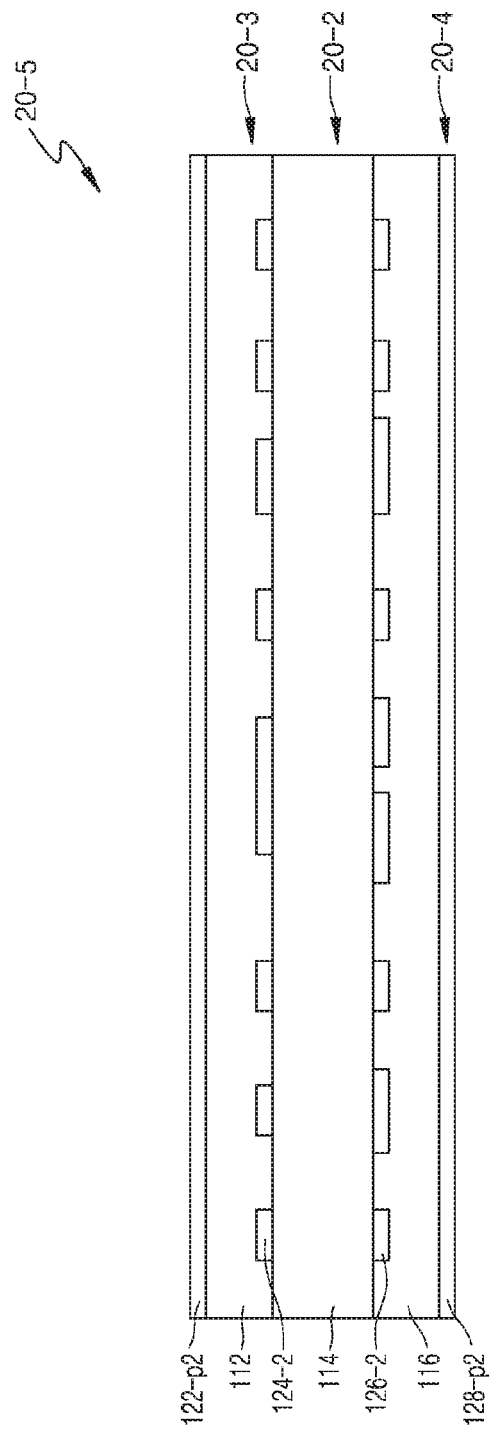

Referring to FIG. 8H, a fifth pre-structure 20-5 is prepared by respectively attaching the third pre-structure 20-3 and the fourth pre-structure 20-4 to one surface and the other surface of the second pre-structure 20-2.

The third pre-structure 20-3 is attached to one surface of the second pre-structure 20-2 so that the first base layer 112 faces the second pre-structure 20-2. Also, the fourth pre-structure 20-4 is attached to the other surface of the second pre-structure 20-2 so that the third base layer 116 faces the second pre-structure 20-2.

Figure 8I:
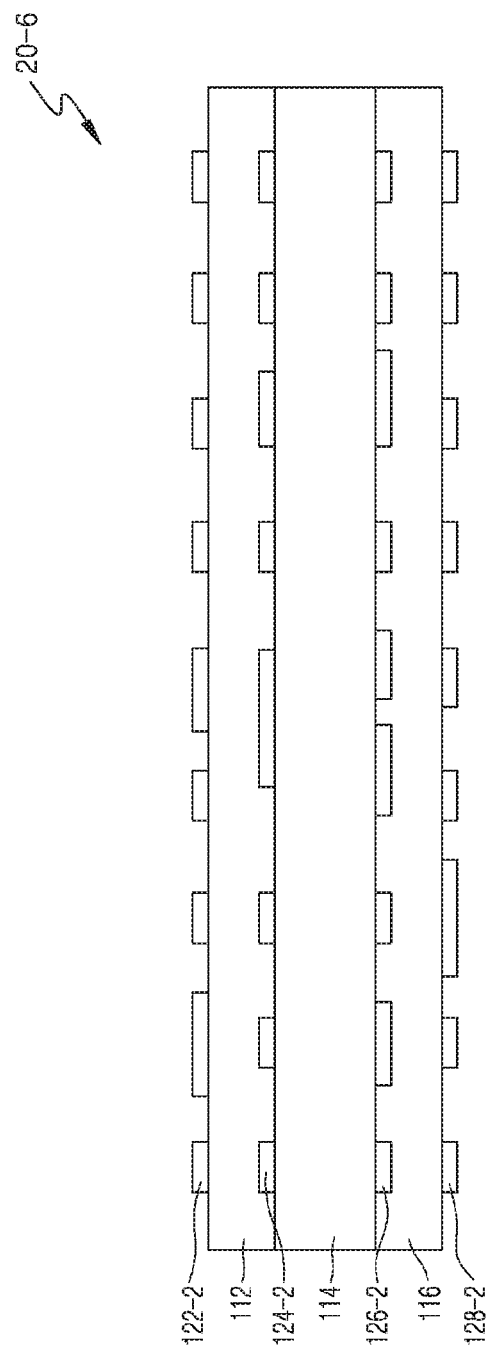

Referring to FIGS. 8H and 8I, a pre-PCB 20-6 is prepared by patterning the first wiring layer 122-*p*2 and the fourth wiring layer 128-*p*2, which are disposed on both surfaces of the fifth pre-structure 20-5, respectively, by using an etching process to form a first wiring pattern 122-2 and a fourth wiring pattern 128-2.

Next, as shown in FIGS. 4 through 6, the PCB 100*d*, 100*e*, or 100*f* may be formed by respectively forming the top solder resist layer 142 and the bottom solder resist layer 144 on a top surface and a bottom surface of the pre-PCB 20-6.

Although a method of forming a PCB including four wiring layers respectively having the first through fourth wiring patterns 122-2, 124-2, 126-2, and 128-2 has been described in FIGS. 8A through 8I, it will be understood by one of ordinary skill in the art that the PCB 100*a*, 100*b*, or 100*c* including three wiring layers as shown in FIGS. 1 through 3 may be formed by omitting any one of the third pre-structure 20-3 or the fourth pre-structure 20-4.

Referring to FIGS. 8A through 8I, elastic moduli and grain sizes of the first through fourth wiring patterns 122-2, 124-2, 126-2, and 128-2 may be made different from one another by adjusting at least one of the first amount and/or the first current density during the first plating method P1*b*, the second amount and/or the second current density during the second plating method P2*b*, the third amount and/or the third current density during the third plating method P3*b*, or the fourth amount and/or the fourth current density during the fourth plating method P4b.

In some example embodiments, a wiring pattern formed by using a plating method with a relatively large current density may have a large elastic modulus and/or a small grain size. Also, a wiring pattern formed by using a plating method with a relatively small current density may have a small elastic modulus and/or a large grain size.

Accordingly, elastic moduli and grain sizes of the first through fourth wiring patterns 122-2, 124-2, 126-2, and 128-2 may be made different from one another by making different at least one of the first through fourth amounts or the first through fourth current densities in the first through fourth plating methods P1b, P2b, P3b, and P4b.

Also, it will be understood by one of ordinary skill in the art that a method of manufacturing a PCB including two wiring layers or five or more wiring layers may be derived from the method of manufacturing the PCB of FIGS. 7A through 7I or FIGS. 8A through 8I, and thus a detailed explanation thereof will not be given.

Figure 9A:
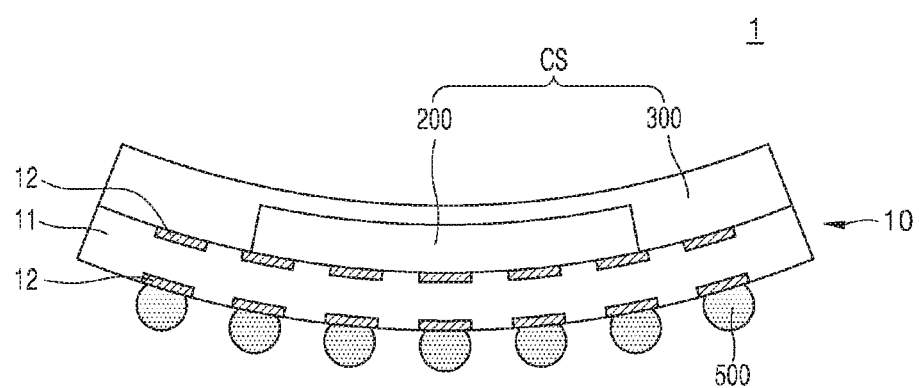
FIG. 9A is a cross-sectional view of a semiconductor package according to a comparative example.
Figure 9B:
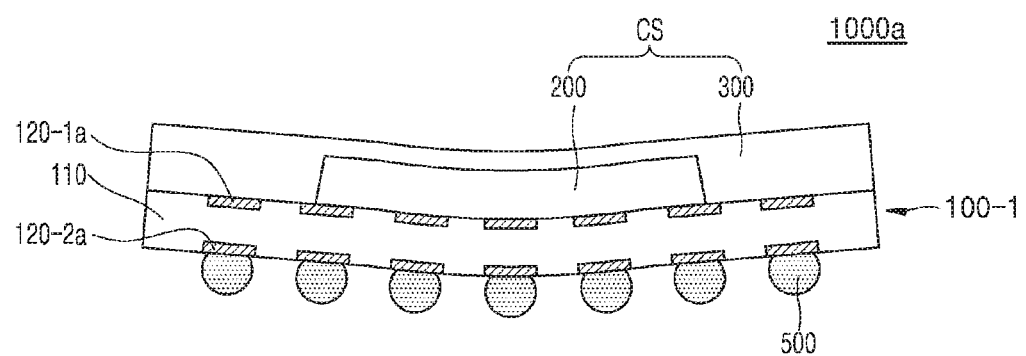
FIG. 9B is a cross-sectional view of a semiconductor package according to an example embodiment.

FIG. 9A is a cross-sectional view of a semiconductor package 1 according to a comparative example. FIG. 9B is a cross-sectional view of a semiconductor package 1000a according to an example embodiment.

Referring to FIG. 9A, the semiconductor package 1 according to the comparative example may include a PCB 10, a semiconductor chip 200 that is attached to a top surface of the PCB 10, and a mold layer 300 that covers at least a part of the top surface of the PCB 10 and the semiconductor chip 200. The semiconductor package 1 may further include an external connection terminal 500 that is attached to a bottom surface of the PCB 10.

The PCB 10 includes a substrate base 11 and a wiring pattern 12 of each of a plurality of wiring layers. For convenience of explanation, FIG. 9A shows that the PCB 10 includes two wiring patterns 12 formed by patterning two wiring layers, respectively. However, the comparative example is not limited thereto. For example, the PCB 10 may include three or more wiring layers.

Elastic moduli or grain sizes of conductive materials, for example, metals, of the wiring patterns 12 of the plurality of wiring layers of the PCB 10 may be substantially the same.

For example, when a thermal expansion coefficient of a chip structure CS including the semiconductor chip 200 and the mold layer 300 is less than a thermal expansion coefficient of the PCB 10, the semiconductor package 1 may be warped into a concave shape.

Referring to FIG. 9B, the semiconductor package 1000a may include a PCB 100-1, the semiconductor chip 200 that is attached to a top surface of the PCB 100-1, and the mold layer 300 that covers at least a part of the top surface of the PCB 100-1 and the semiconductor chip 200. The semiconductor package 1000a may further include the external connection terminal 500 that is attached to a bottom surface of the PCB 100-1.

The PCB 100-1 includes the substrate base 110 and first and second wiring patterns 120-1a and 120-2a of a plurality of wiring layers. For convenience of explanation, FIG. 9B shows that the PCB 100-1 includes two wiring patterns formed by patterning two wiring layers, respectively. However, the inventive concepts are not limited thereto. For example, the PCB 100-1 may include three or more wiring layers.

Elastic moduli or gain sizes of conductive materials, for example, metals, of the first and second wiring patterns 120-1a and 120-2a of the plurality of wiring layers of the PCB 100-1 may be different from one another. In some example embodiments, a metal of the first wiring pattern 120-1a may have an elastic modulus that is greater than that of a metal of the second wiring pattern 120-2a or may have a grain size that is less than that of a metal of the second wiring pattern 120-2a. The PCB 100-1 may be the PCB 100a or 100d of FIG. 1 or 4.

A semiconductor device may be formed on an active surface of the semiconductor chip 200. The semiconductor chip 200 may include, for example, silicon (Si). The semiconductor chip 200 may include a semiconductor element such as germanium (Ge), or a compound semiconductor such as silicon carbide (SiC), gallium arsenide (GaAs), indium arsenide (InAs) or indium phosphide (InP). The semiconductor chip 200 may have a silicon-on-chip (SOI) structure. For example, the semiconductor chip 200 may include a buried oxide (BOX) layer. The semiconductor chip 200 may include a conductive region, for example, a well doped with impurities or a structure doped with impurities. Further, the semiconductor chip 200 may have any of various device isolation structures such as a shallow trench isolation (STI) structure.

The semiconductor device may include a system large scale integration (LSI), a flash memory, a dynamic random-access memory (DRAM), a static RAM (SRAM), an electrically erasable programmable read-only memory (EEPROM), a phase-change RAM (PRAM), a magnetoresistive RAM (MRAM), or a resistive random-access memory (RRAM). Further, the semiconductor device may include any of various individual devices. The plurality of individual devices may include various microelectronic devices, for example, a metal-oxide-semiconductor field effect transistor (MOSFET) such as a complementary metal-insulator-semiconductor (CMOS) transistor, a system LSI, an image sensor such as a CMOS imaging sensor (CIS), a micro-electro-mechanical system (MEMS), an active device, and a passive device. The plurality of individual devices may be electrically connected to the conductive region. The semiconductor device may further include a conductive wiring line or a conductive plug for electrically connecting two or more from among the plurality of individual devices, or the plurality of individual devices and the conductive region. Further, the plurality of individual devices may be electrically separated from other adjacent individual devices by insulating films.

The semiconductor device may be formed to include a multi-layered wiring structure for connecting the plurality of individual devices to other wiring lines. The multi-layered wiring structure may include a metal wiring layer and a via plug. The metal wiring layer and the via plug may include a wiring barrier film and a wiring metal layer. The wiring barrier film may include at least one material selected from among titanium (Ti), titanium nitride (TiN), tantalum (Ta), or tantalum nitride (TaN). The wiring metal layer may include at least one metal selected from among tungsten (W), aluminium (Al), or copper (Cu). The metal wiring layer and the via plug may be formed of the same material. In some example embodiments, at least a part of the metal wiring layer and a part of the via plug may include different materials. A plurality of the metal wiring layers and/or a plurality of the via plugs may form a multi-layered structure. For example, the wiring structure may be a multi-layered structure formed by alternately stacking two or more metal wiring layers or two or more via plugs.

In some example embodiments, the semiconductor chip 200 may be a controller chip, a non-volatile memory chip, a volatile memory chip, and/or a dummy chip.

The non-volatile memory chip may be, for example, a NAND flash memory, an RRAM, an MRAM, a PRAM, or a ferroelectric RAM (FRAM). The non-volatile memory chip may be one non-volatile memory chip or a semiconductor package including a plurality of stacked non-volatile memory chips.

The controller chip may provide an interface and/or a protocol between a host and the non-volatile memory chip. The controller chip may provide a standard protocol such as parallel advanced technology attachment (PATA), serial advanced technology attachment (SATA), or peripheral component interconnect (PCI) express (PCIe) for interfacing between the non-volatile memory chip and the host. In some example embodiments, the controller chip may perform wear levelling, garbage collection, bad block management, and/or error-correcting code (ECC) on the non-volatile memory chip.

The volatile memory chip may be a volatile memory semiconductor chip such as a DRAM. The volatile memory chip may store data or provide a cache. The volatile memory chip may be one volatile memory chip or a semiconductor package including a plurality of stacked volatile memory chips.

For example, even when a thermal expansion coefficient of the chip structure CS including the semiconductor chip 200 and the mold layer 300 is less than a thermal expansion coefficient of the PCB 100-1, stiffness sufficient to mitigate or prevent the PCB 100-1 from being warped into a concave shape may be provided and warpage may be offset, thereby mitigating or preventing the warpage of the semiconductor package 1000a including the PCB 100-1.

Figure 10A:
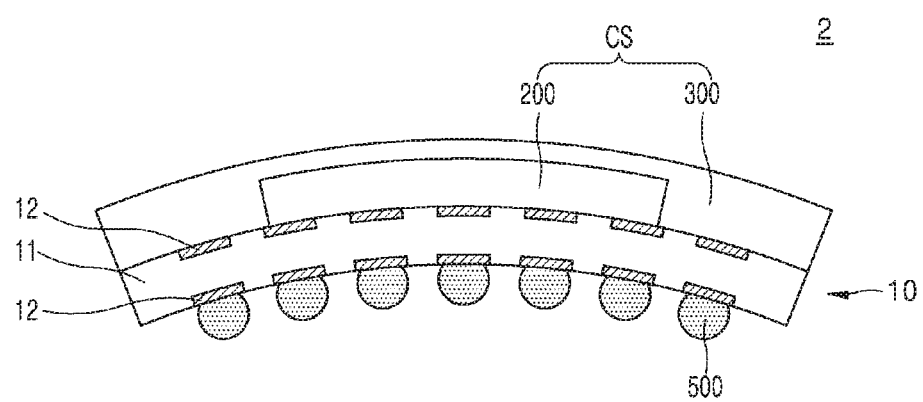
FIG. 10A is a cross-sectional view of a semiconductor package according to a comparative example.
Figure 10B:
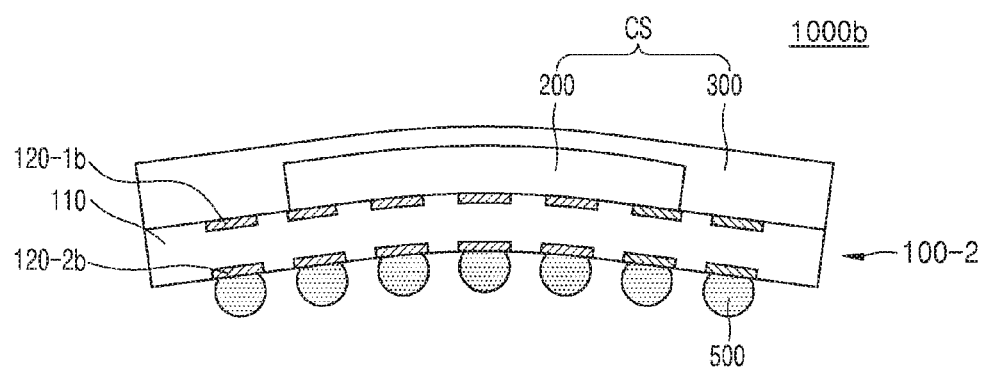
FIG. 10B is a cross-sectional view of a semiconductor package according to an example embodiment.

FIG. 10A is a cross-sectional view of a semiconductor package 2 according to a comparative example. FIG. 10B is a cross-sectional view of a semiconductor package 1000b according to an example embodiment.

Referring to FIG. 10A, the semiconductor package 2 according to a comparative example may include the PCB 10, the semiconductor chip 200 that is attached to a top surface of the PCB 10, and the mold layer 300 that covers at least a part of the top surface of the PCB 10 and the semiconductor chip 200. The semiconductor package 2 may further include the external connection terminal 500 that is attached to a bottom surface of the PCB 10.

The PCB 10 includes the substrate base 11 and the wiring pattern 12 of each of a plurality of wiring layers. For convenience of explanation, FIG. 10A shows that the PCB 10 includes two wiring pattern 12 by patterning two wiring layers. However, the comparative example is not limited thereto. For example, the PCB 10 may include three or more wiring layers.

Elastic moduli or grain sizes of conductive materials, for example, metals, of the wiring patterns 12 of the plurality of wiring layers of the PCB 10 may be substantially the same.

For example, when a thermal expansion coefficient of the chip structure CS including the semiconductor chip 200 and the mold layer 300 is greater than a thermal expansion coefficient of the PCB 10, the semiconductor package 2 may be warped into a convex shape.

Referring to FIG. 10B, the semiconductor package 1000b may include a PCB 100-2, the semiconductor chip 200 that is attached to a top surface of the PCB 100-2, and the mold layer 300 that covers at least a part of the top surface of the PCB 100-2 and the semiconductor chip 200. The semiconductor package 1000b may further include the external connection terminal 500 that is attached to a bottom surface of the PCB 100-2.

The PCB 100-2 includes the substrate base 110 and first and second wiring patterns 120-1b and 120-2b of a plurality of wiring layers. For convenience of explanation, FIG. 10B shows that the PCB 100-2 includes two wiring patterns 120-1b and 120-2b formed by patterning two wiring layers in FIG. 10B, the inventive concepts are not limited thereto. For example, the PCB 100-2 may include three or more wiring layers.

Elastic moduli or grain sizes of conductive materials, for example, metals, of the first and second wiring patterns 120-1b and 120-2b of the plurality of wiring layers of the PCB 100-2 may be different from one another. In some example embodiments, a metal of the first wiring pattern 120-1b may have an elastic modulus that is less than that of a metal of the second wiring pattern 120-2b or may have a grain size that is greater than that of a metal of the second wiring pattern 120-2b. The PCB 100-1 may be the PCB 100b or 100e of FIG. 2 or 5.

For example, even when a thermal expansion coefficient of the chip structure CS including the semiconductor chip 200 and the mold layer 300 is greater than a thermal expansion coefficient of the PCB 100-2, stiffness sufficient to prevent the PCB 100-2 from being warped into a convex shape may be provided and warpage may be offset, thereby mitigating or preventing the warpage of the semiconductor package 1000b including the PCB 100-2.

FIGS. 11A through 11D are cross-sectional views of semiconductor packages according to an example embodiment.

Figure 11A:
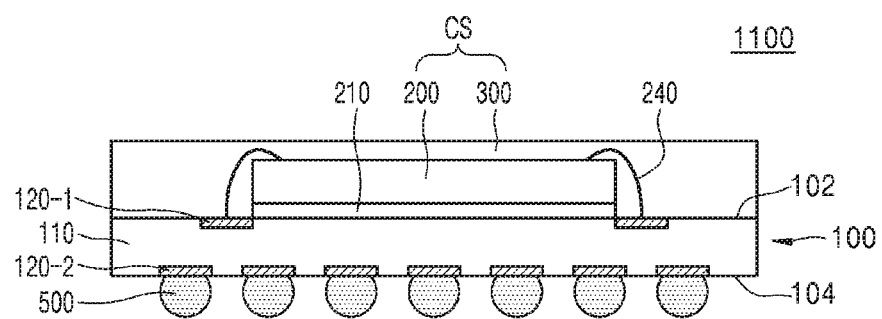
FIGS. 11A through 11D are cross-sectional views of semiconductor packages according to an example embodiment.

Referring to FIG. 11A, a semiconductor package 1100 may include a PCB 100, the semiconductor chip 200 that is attached to a top surface 102 of the PCB 100, and the mold layer 300 that covers at least a part of the top surface 102 of the PCB 100 and the semiconductor chip 200. The semiconductor package 1100 may further include the external connection terminal 500 that is attached to a bottom surface 104 of the PCB 100.

The PCB 100 includes the substrate base 110 and first and second wiring patterns 120-1 and 120-2 of a plurality of wiring layers.

The semiconductor chip 200 may be attached to the top surface 102 of the PCB 100 with a die attach film 210 therebetween. The semiconductor chip 200 may be electrically connected to the first wiring pattern 120-1 through bonding wires 240. The external connection terminal 500 may be electrically connected to the second wiring pattern 120-2.

Elastic moduli or grain sizes of conductive materials, for example, metals, of the first and second wiring patterns 120-1 and 120-2 of the plurality of wiring layers of the PCB 100 may be different from one another. In some example embodiments, a metal of the first wiring pattern 120-1 may have an elastic modulus that is greater than that of a metal of the second wiring pattern 120-2 or may have a grain size that is less than that of a metal of the second wiring pattern 120-2. In some example embodiments, a metal of the first wiring pattern 120-1 may have an elastic modulus less than a metal of the second wiring pattern 120-2 or may have a grain size greater than a metal of the second wiring pattern 120-2.

As described with reference to FIGS. 9A through 10B, considering a difference between a thermal expansion coefficient of the chip structure CS including the semiconductor chip 200 and the mold layer 300 and a thermal expansion coefficient of the PCB 100, elastic moduli or grain sizes of conductive materials, for example, metals, of the first and second wiring patterns 120-1 and 120-2 may be determined or adjusted to provide stiffness sufficient to mitigate or prevent the PCB 100 from being warped.

For example, the PCB 100 may be any of the PCBs 100a, 100b, 100d, and 100e of FIGS. 1, 2, 4, and 5.

Figure 11B:
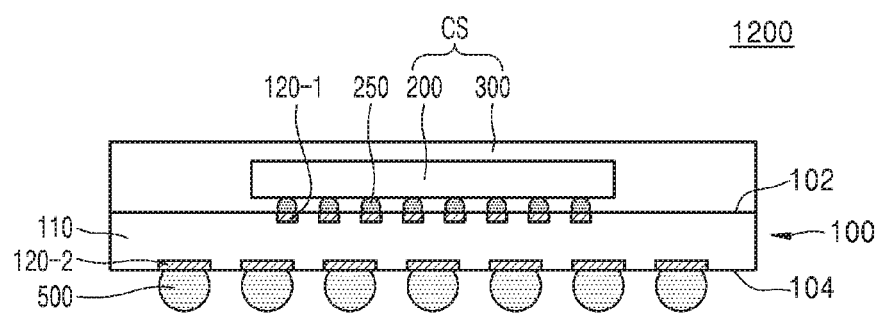

Referring to FIG. 11B, a semiconductor package 1200 may include the PCB 100, the semiconductor chip 200 that is attached to the top surface 102 of the PCB 100, and the mold layer 300 that covers at least a part of the top surface 102 of the PCB 100 and the semiconductor chip 200. The semiconductor package 1200 may further include the external connection terminal 500 that is attached to the bottom surface 104 of the PCB 100.

The PCB 100 includes the substrate base 110 and the first and second wiring patterns 120-1 and 120-2 of a plurality of wiring layers.

The semiconductor chip 200 may be attached to the top surface 102 of the PCB 100 with connection bumps 250 therebetween. The semiconductor chip 200 may be electrically connected to the first wiring pattern 120-1. The external connection terminal 500 may be electrically connected to the second wiring pattern 120-2.

Elastic moduli or grain sizes of conductive materials, for example, metals, of the first and second wiring patterns 120-1 and 120-2 of the plurality of wiring layers of the PCB 100 may be different from one another. In some example embodiments, a metal of the first wiring pattern 120-1 may have an elastic modulus greater than a metal of the second wiring pattern 120-2 or may have a grain size less than a metal of the second wiring pattern 120-2. In some example embodiments, a metal of the first wiring pattern 120-1 may have an elastic modulus less than a metal of the second wiring pattern 120-2 or may have a grain size greater than a metal of the second wiring pattern 120-2.

As described with reference to FIGS. 9A through 10B, considering a difference between a thermal expansion coefficient of the chip structure CS including the semiconductor chip 200 and the mold layer 300 and a thermal expansion coefficient of the PCB 100, elastic moduli or grain sizes of conductive materials, for example, metals, of the first and second wiring patterns 120-1 and 120-2 may be determined or adjusted to provide stiffness sufficient to mitigate or prevent the PCB 100 from being warped.

For example, the PCB 100 may be any of the PCBs 100a, 100b, 100d, and 100e of FIGS. 1, 2, 4, and 5.

Figure 11C:
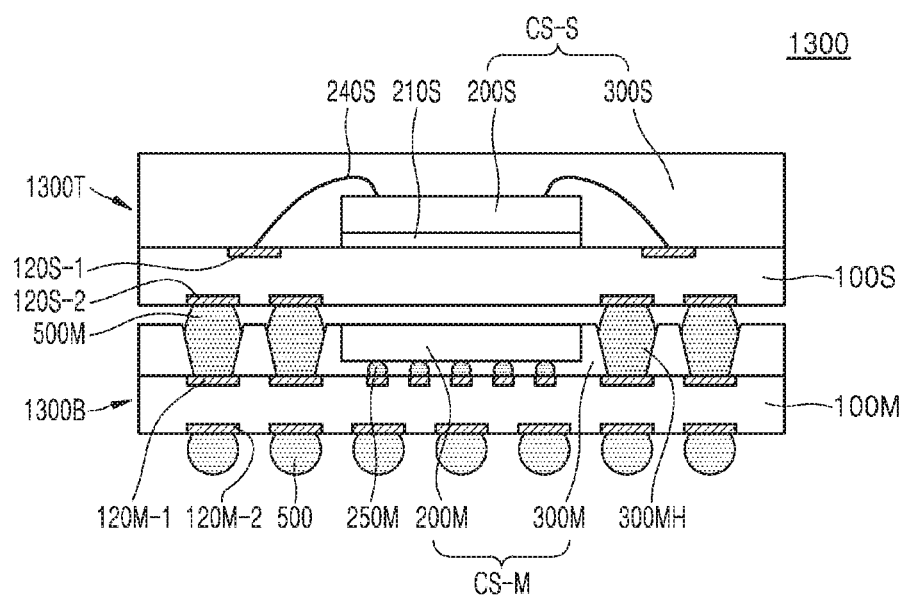

Referring to FIG. 11C, a semiconductor package 1300 may include a lower package 1300B and an upper package 1300T that is stacked on the lower package 1300B. The semiconductor package 1300 may be a package on package (PoP).

The lower package 1300B may include a main PCB 100M, a main semiconductor chip 200M that is attached to a top surface of the main PCB 100M, and a main mold layer 300M that covers at least a part of the main semiconductor chip 200M and at least a part of the top surface of the main PCB 100M. The semiconductor package 1300 may further include the external connection terminal 500 that is attached to a bottom surface of the main PCB 100M.

The main PCB 100M includes first and second main wiring patterns 120M-1 and 120M-2 of a plurality of wiring layers.

The main semiconductor chip 200M may be attached to the top surface 102 of the PCB 100 with chip connection bumps 250M therebetween. The semiconductor chip 200 may be electrically connected to the first main wiring pattern 120M-1 through the chip connection bumps 250M. The external connection terminal 500 may be electrically connected to the second main wiring pattern 120M-2.

The upper package 1300T may include a sub-PCB 100S, a sub-semiconductor chip 200S that is attached to a top surface of the sub-PCB 100S, and a sub-mold layer 300S that covers at least a part of the top surface of the sub-PCB 100S and the sub-semiconductor chip 200S.

The sub-PCB 100S includes first and second sub-wiring patterns 120S-1 and 120S-2 of a plurality of wiring layers.

The sub-semiconductor chip 200S may be attached to the top surface of the sub-PCB 100S with a die attach film 210S therebetween. The sub-semiconductor chip 200S may be electrically connected to the first sub-wiring pattern 120-1S through bonding wires 240S.

The main mold layer 300M may have mold holes 300MH through which at least a part of the first main wiring pattern 120M-1 is exposed. The second sub-wiring pattern 120S-2 of the upper package 1300T and the first main wiring pattern 120M-1 of the lower package 1300B may be electrically connected through main connection bumps 500M that are disposed in the mold holes 300MH.

Elastic moduli or grain sizes of conductive materials, for example, metals, of the first and second main wiring patterns 120M-1 and 120M-2 of the plurality of wiring layers of the main PCB 100M may be different from one another. In some example embodiments, a metal of the first main wiring pattern 120M-1 may have an elastic modulus greater than a metal of the second main wiring pattern 120M-2 or may have a grain size less than a metal of the second main wiring pattern 120M-2. In some example embodiments, a metal of the first main wiring pattern 120M-1 may have an elastic modulus less than a metal of the second main wiring pattern 120M-2 or may have a grain size greater than a metal of the second main wiring pattern 120M-2.

As described with reference to FIGS. 9A through 10B, considering a difference between a thermal expansion coefficient of a main chip structure CS-M including the main semiconductor chip 200M and the main mold layer 300M and a thermal expansion coefficient of the main PCB 100M, elastic moduli or grain sizes of conductive materials, for example, metals, of the first and second main wiring patterns 120M-1 and 120M-2 may be determined or adjusted to provide stiffness sufficient to mitigate or prevent the main PCB 100M from being warped.

For example, the main PCB 100M may be any of the PCBs 100a, 100b, 100d, and 100e of FIGS. 1, 2, 4, and 5.

Elastic moduli or grain sizes of conductive materials, for example, metals, of the first and second sub-wiring patterns 120S-1 and 120S-2 of the plurality of wiring layers of the sub-PCB 100S may be different from one another. In some example embodiments, a metal of the first sub-wiring pattern 120S-1 may have an elastic modulus greater than a metal of the second sub-wiring pattern 120S-2 or may have a grain size less than a metal of the second sub-wiring pattern 120S-2. In some example embodiments, a metal of the first sub-wiring pattern 120S-1 may have an elastic modulus less than a metal of the second sub-wiring pattern 120S-2 or may have a grain size greater than a metal of the second sub-wiring pattern 120S-2.

As described with reference to FIGS. 9A through 10B, considering a difference between a thermal expansion coefficient of a sub-chip structure CS-S including the sub-semiconductor chip 200S and the sub-mold layer 300S and a thermal expansion coefficient of the sub-PCB 100S, elastic moduli or grain sizes of conductive materials, for example, metals, of the first and second sub-wiring patterns 120S-1 and 120S-2 may be determined or adjusted to provide stiffness sufficient to mitigate or prevent the sub-PCB 100S from being warped.

For example, the sub-PCB 100S may be any of the PCBs 100a, 100b, 100d, and 100e of FIGS. 1, 2, 4, and 5.

Alternatively, first and second elastic moduli and/or first and second grain sizes of metals of the first and second sub-wiring patterns 120S-1 and 120S-2 of the plurality of wiring layers of the sub-PCB 100S may be different from the first and second elastic moduli and/or first and second grain sizes of metals of the first and second main wiring patterns 120M-1 and 120M-2 of the plurality of wiring layers of the main PCB 100M.

Considering a difference between a thermal expansion coefficient of the upper package 1300T and a thermal expansion coefficient of the lower package 1300B, the first and second elastic moduli and/or the first and second grain sizes of the metals of the first and second sub-wiring patterns 120S-1 and 120S-2 and the first and second elastic moduli and/or the first and second grain sizes of the metals of the first and second main wiring patterns 120M-1 and 120M-2 may be determined to provide stiffness sufficient to prevent the sub-PCB 100S included in the upper package 1300T and/or the main PCB 100M included in the lower package 1300B from being warped.

Figure 11D:
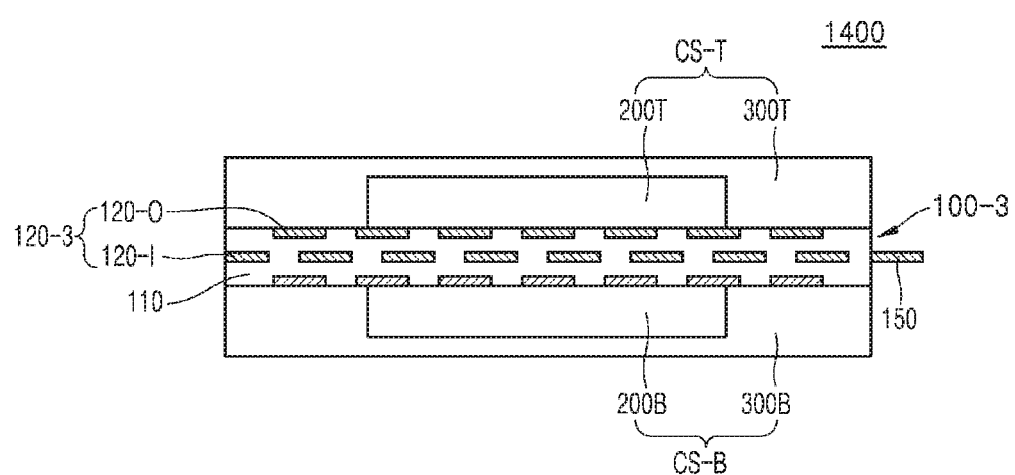

Referring to FIG. 11D, a semiconductor package 1400 may include a PCB 100-3, first and second semiconductor chips 200T and 200B that are attached to a top surface and a bottom surface of the PCB 100-3, respectively, a first mold layer 300T that covers at least a part of the top surface of the PCB 100-3 and the first semiconductor chip 200T, and a second mold layer 300B that covers at least a part of the bottom surface of the PCB 100-3 and the second semiconductor chip 200B.

The semiconductor package 1400 may further include an external connection terminal 150 that is connected to the PCB 100-3. Although the external connection terminal 150 is located at a side of the PCB 100-3 in FIG. 11D, the inventive concepts are not limited thereto. For example, the external connection terminal 150 may be located on the top surface and/or the bottom surface of the PCB 100-3.

The PCB 100-3 includes the substrate base 110 and a wiring pattern 120-3 of each of a plurality of wiring layers. The wiring pattern 120-3 includes an inner wiring pattern 120-I of an inner wiring layer of the substrate base 110 and outer wiring patterns 120-O of wiring layers disposed on a top surface and a bottom surface of the substrate base 110.

A metal of the inner wiring pattern 120-I may have an elastic modulus greater than a metal of each of the outer wiring patterns 120-O or may have a grain size less than a metal of each of the outer wiring patterns 120-O.

Even when a thermal expansion coefficient of a first chip structure CS-T, which includes the first semiconductor chip 200T and the first mold layer 300T, and a thermal expansion coefficient of a second chip structure CS-B, which includes the second semiconductor chip 200B and the second mold layer 300B, are similar to each other and are different from a thermal expansion coefficient of the PCB 100-3, in the PCB 100-3 according to an example embodiment, because an elastic modulus of a metal of the inner wiring pattern 120-I is greater than an elastic modulus of a metal of the outer wiring pattern 120-O, stiffness may be provided to the center of the PCB 100-3. Accordingly, reliability of the semiconductor package 1400 including the PCB 100-3 may be improved.

For example, the PCB 100-3 may be any of the PCBs 100c and 100f of FIGS. 3 and 6.

Figure 12A:
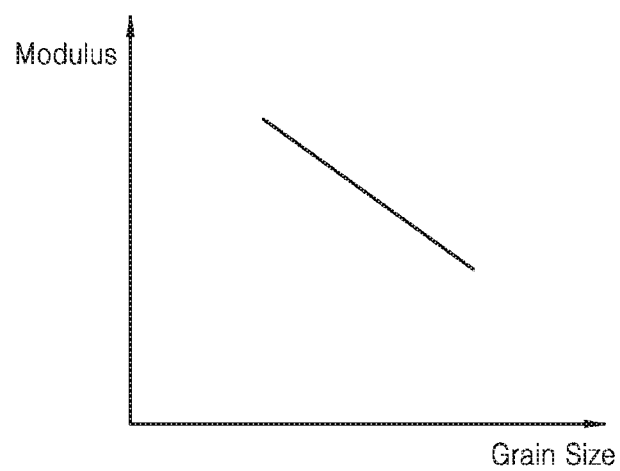
FIG. 12A is a graph showing a relationship between a grain size of a conductive material and an elastic modulus of the conductive material to explain an elastic modulus of a conductive material of a wiring pattern included in a PCB according to an example embodiment.

FIG. 12A is a graph showing a relationship between a grain size of a conductive material and an elastic modulus of the conductive material to explain an elastic modulus of a conductive material of a wiring pattern included in a PCB according to an example embodiment.

Referring to FIG. 12A, when a grain size of a conductive material of a wiring pattern included in a PCB decreases within a desired (or alternatively, predetermined) range, an elastic modulus may increase.

Figure 12B:
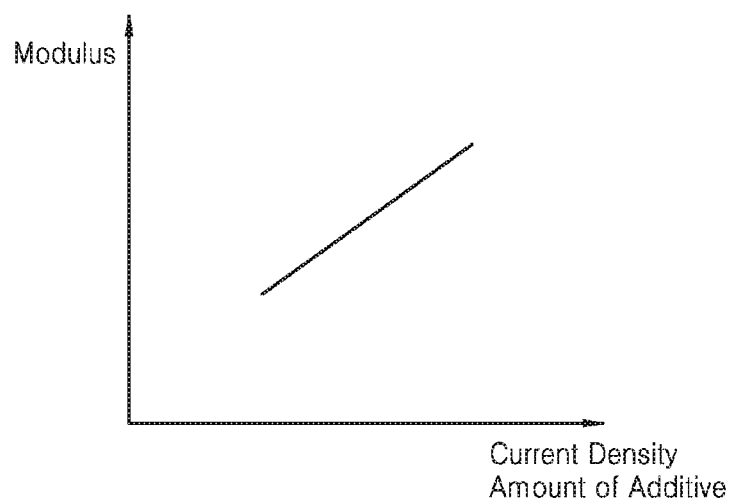
FIG. 12B is a graph showing a relationship between a current density or the amount of an additive used in a plating method of forming a conductive material and an elastic modulus of the conductive material to explain an elastic modulus of a conductive material of a wiring pattern included in a PCB according to an example embodiment.

FIG. 12B is a graph showing a relationship between a current density or the amount of an additive used in a plating method of forming a conductive material and an elastic modulus of the conductive material to explain an elastic modulus of a conductive material of a wiring pattern included in a PCB according to an example embodiment.

Referring to FIG. 12B, assuming that a conductive material, for example, a metal, of a wiring pattern included in a PCB is formed by using a plating method, when a current density and/or the amount of an additive increases within a desired (or alternatively, predetermined) range, an elastic modulus may increase.

Referring to FIGS. 12A and 12B, assuming that a conductive material, for example, a metal, of a wiring pattern is formed by using a plating method, when a current density and/or the amount of an additive is increased within a desired (or alternatively, predetermined) range, a grain size of the metal may be reduced, and thus an elastic modulus may be increased.

Figure 13:
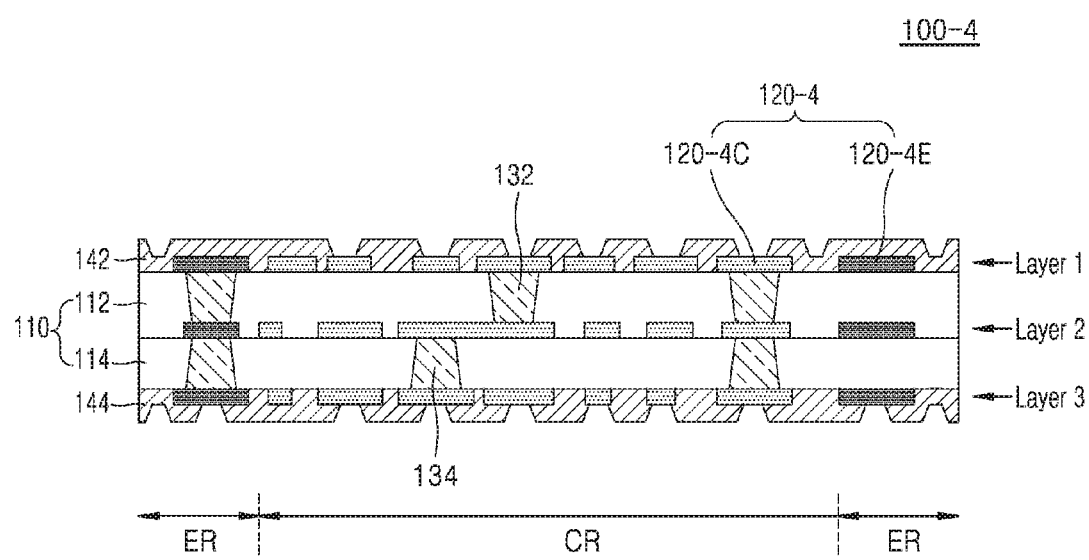
FIG. 13 is a cross-sectional view of a PCB according to an example embodiment.

FIG. 13 is a cross-sectional view of a PCB 100-4 according to an example embodiment.

Referring to FIG. 13, the PCB 100-4 includes the substrate base 110 and the first through third wiring layers 1, 2, and 3 each having a wiring pattern 120-4.

The substrate base 110 may be formed by stacking a plurality of base layers, for example, the first and second base layers 112 and 114.

Each of the first through third wiring layers 1, 2, and 3 may have the wiring pattern 120-4. The wiring pattern 120-4 may be formed of a conductive material. In some example embodiments, the wiring pattern 120-4 may be formed of a metal.

The PCB 100-4 may include an edge portion ER adjacent to an edge of the substrate base 110 and a central portion CR adjacent to the center of the substrate base 110. In some example embodiments, when the PCB 100-4 has a square flat panel shape, the edge portion ER may be a part of an edge of the square flat panel shape and the central portion CR may be at least a part of the PCB 100-4 other than the edge portion ER.

The wiring pattern 120-4 may include an edge wiring pattern 120-4E that is formed on the edge portion ER and a central wiring pattern 120-4C that is formed on the central portion CR.

An elastic modulus of a conductive material of the central wiring pattern 120-4C may be less than an elastic modulus of a conductive material of the edge wiring pattern 120-4E.

A grain size of a metal of the central wiring pattern 120-4C may be greater than a grain size of a metal of the edge wiring pattern 120-4E.

The first and second conductive vias 132 and 134 that electrically connect the wiring pattern 120-4 may be formed in the substrate base 110.

The top solder resist layer 142 and the bottom solder resist layer 144 may be formed on the top surface and the bottom surface of the substrate base 110, respectively.

When the PCB 100-4 has a small thickness or has a large area like an array PCB, the edge portion CR of the PCB 100-4 may be warped.

However, in the PCB 100-4 according to an example embodiment, because an elastic modulus of a conductive material of the edge wiring pattern 120-4E is greater than an elastic modulus of a conductive material of the central wiring pattern 120-4C, stiffness sufficient to mitigate of prevent the edge portion CR of the PCB 100-4 from being warped may be provided.

FIGS. 14A through 14F are cross-sectional views for explaining a method of manufacturing a PCB, according to an example embodiment. FIGS. 14A through 14F are cross-sectional views for explaining a process of forming two wiring layers of the PCB 100-4 of FIG. 13.

Figure 14A:
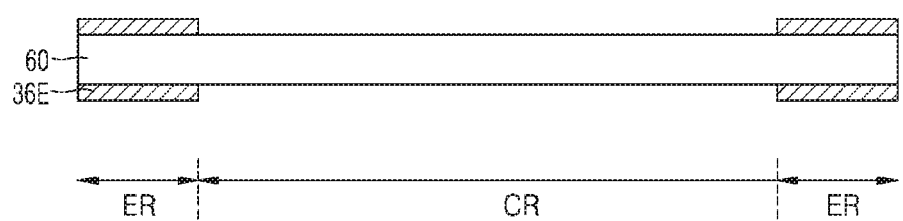
FIGS. 14A through 14F are cross-sectional views for explaining a method of manufacturing a PCB, according to an example embodiment.

Referring to FIG. 14A, a base layer 60 is prepared. An edge mask layer 36E that covers the edge portion ER of the base layer 60 is formed. The edge mask layer 36E may cover the edge portion ER of each of both surfaces of the base layer 60. In some example embodiments, the edge mask layer 36E may cover the edge portion ER of only one surface of the base layer 60.

Figure 14B:
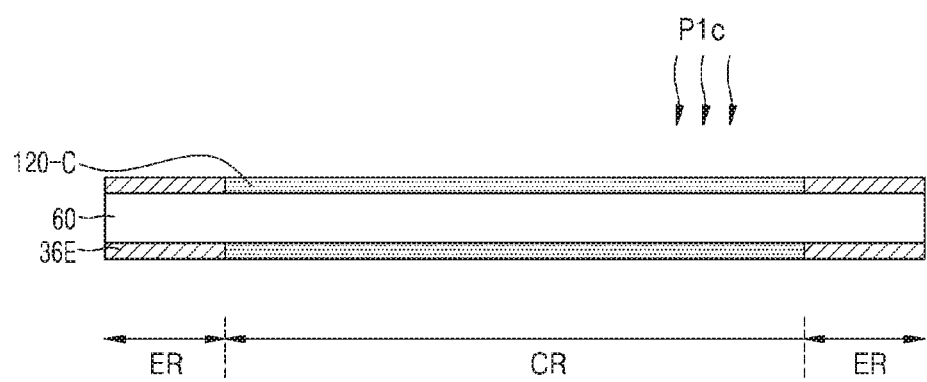

Referring to FIG. 14B, a central wiring layer 120-C is formed on the central portion CR of the base layer 60 by performing a first plating method P1c on a surface of the base layer 60 (e.g., on the central portion CR), which is not covered by the edge mask layer 36E. For example, the central wiring layer 120-C may be formed of copper.

The first plating method P1c may be performed by applying current at a first current density by using a plating solution containing a first amount of additive.

Figure 14C:
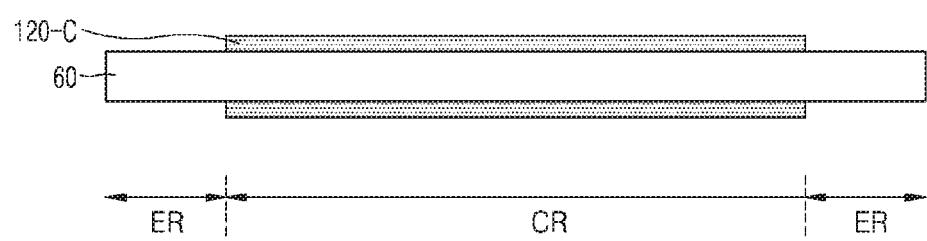

Referring to FIGS. 14B and 14C, after the central wiring layer 120-C is formed, the edge mask layer 36E is removed.

Figure 14D:
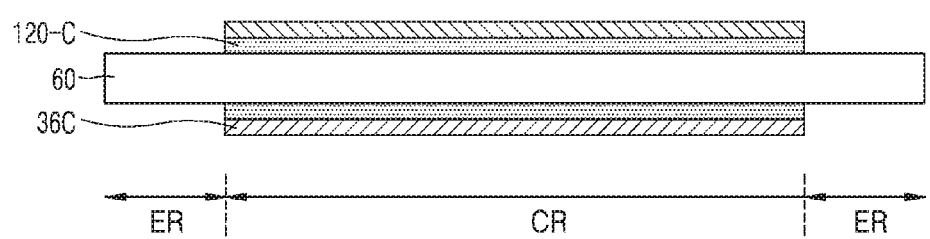

Referring to FIG. 14D, a central mask layer 36C, which covers the central wiring layer 120-C formed on the central portion CR of the base layer 60, is formed.

Figure 14E:
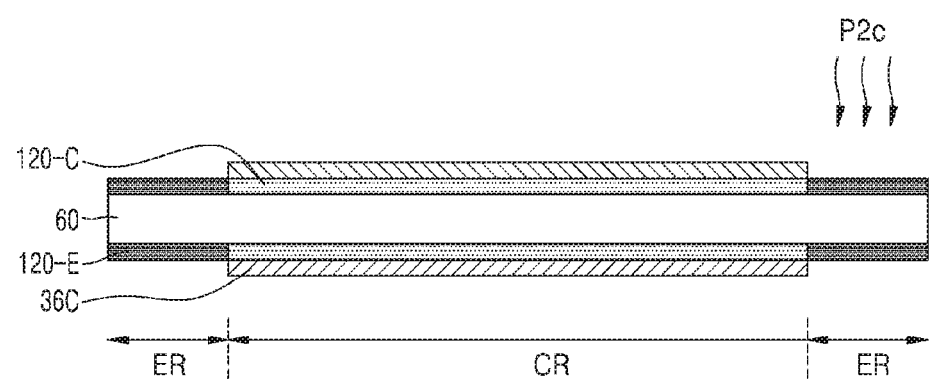

Referring to FIG. 14E, an edge wiring layer 120-E is formed on the edge portion ER of the base layer 60 by performing a second plating method P2c on a surface of the base layer 60 (e.g., on the edge portion ER), which is not covered by the central mask layer 36C. For example, the edge wiring layer 120-E may be formed of copper.

The second plating method P2c may be performed by applying current at a second current density by using a plating solution containing a second amount of additive.

Figure 14F:
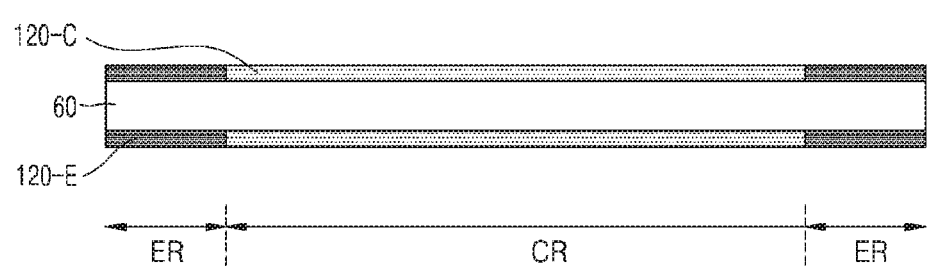

Referring to FIGS. 14E and 14F, after the edge wiring layer 120-E is formed, the central mask layer 36C is removed.

Next, as shown in FIG. 13, the edge wiring pattern 120-4E and the central wiring pattern 120-4C may be formed by patterning the edge wiring layer 120-E and the central wiring layer 120-C by using an etching process.

Referring to FIGS. 14A through 14F, elastic moduli and grain sizes of the central wiring pattern 120-4C and the edge wiring pattern 120-4E may be made different from one another as shown in FIG. 13 by adjusting at least one of (1) the first amount and/or the first current density during the first plating method P1c or (2) the second amount and/or the second current density during the second plating method P2c.

Figure 15:
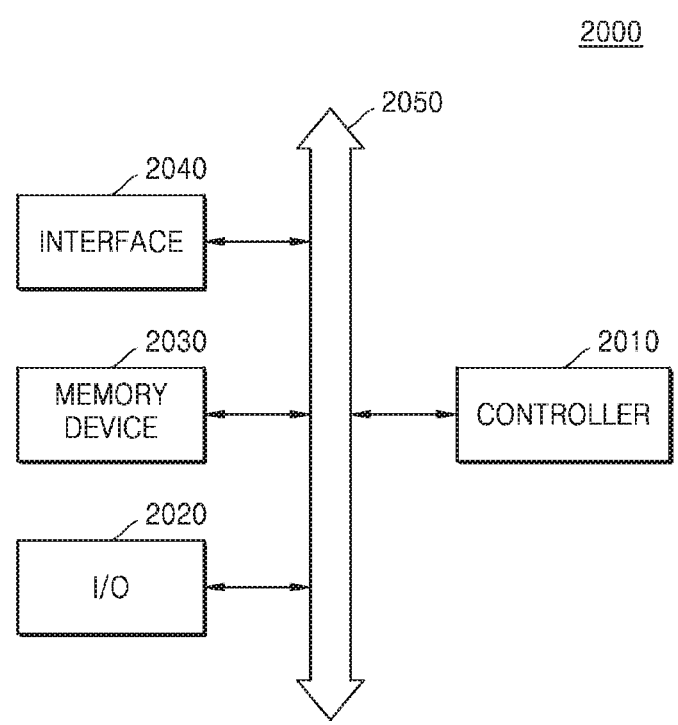
FIG. 15 is a block diagram of a system according to an example embodiment.

FIG. 15 is a block diagram of a system 2000 according to an example embodiment.

Referring to FIG. 15, the system 2000 includes a controller 2010, an input/output device 2020, a memory device 2030, and an interface 2040. The system 2000 may be a mobile system or a system for transmitting or receiving information. In some example embodiments, the mobile system is a personal digital assistant (PDA), a portable computer, a web tablet, a wireless phone, a mobile phone, a digital music player, or a memory card. The system 2000 includes a PCB and/or a semiconductor package according to an example embodiment. For example, the system 2000 may include at least one of the PCBs 100, 100a, 100b, 100c, 100d, 100e, 100f, 100-1, 100-2, 100-3, or 100-4 and/or at least one of the semiconductor packages 1000a, 1000b, 1100, 1200, 1300, or 1400 of FIG. 1 through 14F.

The controller 2010 for controlling an execution program in the system 2000 may include a microprocessor, a digital signal processor, a microcontroller, or the like. For example, the controller 2010 may include at least one of the PCBs 100, 100a, 100b, 100c, 100d, 100e, 100f, 100-1, 100-2, 100-3, or 100-4, and/or at least one of the semiconductor packages 1000a, 1000b, 1100, 1200, 1300, or 1400 of FIG. 1 through 14F.

The input/output device 2020 may be used to input or output data of the system 2000. The system 2000 may be connected to an external device, for example, a personal computer or a network, through the input/output device 2020 and may exchange data with the external device. The input/output device 2020 may be, for example, a keypad, a keyboard, or a display device.

The memory device 2030 may store code and/or data for operating the controller 2010 or may store data processed by the controller 2010. For example, the memory device 2030 may include at least one of the PCBs 100, 100a, 100b, 100c, 100d, 100e, 100f, 100-1, 100-2, 100-3, or 100-4, and/or at least one of the semiconductor packages 1000a, 1000b, 1100, 1200, 1300, or 1400 of FIG. 1 through 14F.

The interface 2040 may be a data transmission path between the system 2000 and an external device. The controller 2010, the input/output device 2020, the memory device 2030, and the interface 2040 may communicate with one another via a bus 2050. The system 2000 may be applied to a mobile phone, an MP3 player, a navigation system, a portable multimedia player (PMP), a solid state disk (SSD), or a household appliance.

In a PCB and a semiconductor package including the same according to the one or more example embodiments, because an elastic modulus of a conductive material of a wiring pattern of at least one wiring layer from among a plurality of wiring layers of the PCB is different from an elastic modulus of a conductive material of a wiring pattern of at least one other wiring layer, the warpage of the semiconductor package may be mitigated or prevented even when a thickness of the semiconductor device is reduced. Also, in the PCB and the semiconductor package including the same according to the one or more example embodiments, because an elastic modulus of a conductive material of a wiring pattern of at least one wiring layer disposed in the PCB from among the plurality of wiring layers of the PCB is greater than an elastic modulus of a conductive material of a wiring pattern of a wiring layer on a surface of the PCB, stiffness may be provided to the center of the PCB. Accordingly, poor contact between a semiconductor chip and the PCB and damage to the PCB may be mitigated or prevented, thereby improving the reliability of the semiconductor package.

In a method of manufacturing a PCB according to some example embodiments, the warpage of a semiconductor package including a PCB may be mitigated or prevented, and thus reliability of a semiconductor package including the PCB may be improved.

While the inventive concepts have been particularly shown and described with reference to some example embodiments thereof, it will be understood that various changes in form and details may be made therein without departing from the spirit and scope of the following claims.

What is claimed is:

1. A printed circuit board (PCB) comprising:
   a substrate base including at least two stacked base layers, the at least two stacked base layers including a first base layer and second base layer on the first base layer; and
   a plurality of wiring layers on top surfaces and bottom surfaces of respective ones of the at least two stacked base layers, the plurality of wiring layers comprise at least three wiring layers, the plurality of wiring layers each defining a plurality of wiring patterns, respectively,
   wherein the plurality of wiring layers include one wiring layer on the first base layer and another wiring layer on the second based layer, and
   an elastic modulus of the one wiring layer and an elastic modulus of the another wiring layer change in a direction perpendicular to the substrate base.

2. The PCB of claim 1, wherein a top surface of the PCB is a chip attachment surface to which a semiconductor chip is attached and a bottom surface of the PCB is a connection terminal attachment surface to which an external connection terminal is attached.

3. The PCB of claim 2, wherein an elastic modulus of a first wiring layer on a top surface of the substrate base from among the plurality of wiring layers is greater than an elastic modulus of a second wiring layer on a bottom surface of the substrate base from among the plurality of wiring layers.

4. The PCB of claim 3, wherein elastic moduli of respective ones of the plurality of wiring layers increase from the second wiring layer on the bottom surface of the substrate base to the first wiring layer on the top surface of the substrate base.

5. The PCB of claim 2, wherein an elastic modulus of a first wiring layer, which is on a top surface of the substrate base, from among the plurality of wiring layers is less than an elastic modulus of a second wiring layer, which is on a bottom surface of the substrate base, from among the plurality of wiring layers.

6. The PCB of claim 5, wherein elastic moduli of respective ones of the plurality of wiring layers decrease from the second wiring layer on the bottom surface of the substrate base to the first wiring layer on the top surface of the substrate base.

7. The PCB of claim 1, wherein from among the plurality of wiring layers, an elastic modulus of a first wiring layer in the substrate base is greater than an elastic modulus of a second wiring layer on each of a top surface and a bottom surface of the substrate base.

8. The PCB of claim 1, wherein
   the wiring patterns defined by the plurality of wiring layers comprise a same metal, and
   a grain size of the metal of at least one wiring layer from among the plurality of wiring layers is greater than a grain size of the metal of at least one other wiring layer from among the plurality of wiring layers.

9. The PCB of claim 8, wherein the plurality of wiring patterns comprise copper.

10. The PCB of claim 8, wherein the plurality of wiring layers are plated wiring layers.

11. A printed circuit board (PCB) comprising:
    a substrate base including at least one base layer; and
    a plurality of wiring layers on a top surface and a bottom surface of the at least one base layer, the plurality of wiring layers defining a plurality of wiring patterns, respectively, a grain size of a metal of a first part of one wiring pattern from among the plurality of wiring patterns being greater than a grain size of a metal of a second part of the one wiring pattern from among the plurality of wiring patterns,
    wherein the first part is adjacent to an edge of the substrate base and the second part is adjacent to a center of the substrate base in a direction parallel to the substrate base.

12. The PCB of claim 11, wherein from among the plurality of wiring patterns, a grain size of a metal of a wiring pattern on a first surface of the substrate base is less than a grain size of a metal of a wiring pattern on a second surface of the substrate base, the second surface being opposite to the first surface.

13. The PCB of claim 11, wherein the substrate base comprises at least two stacked base layers,
    wherein a grain size of a metal of a first wiring pattern from among the plurality of wiring patterns is greater than. a grain size of a metal of a second wiring pattern from among the plurality of wiring patterns, the first wiring pattern between the stacked base layers and the second wiring pattern on a bottom surface or a top surface of the stacked base layers.

14. The PCB of claim 11, wherein the first part has an elastic modulus less than the second part.

15. A semiconductor package comprising:
    a printed circuit board (PCB) including,
    a plurality of base layers, and a plurality of wiring patterns including a first wiring pattern on a top surface of a stacked structure of the plurality of base layers, a second wiring pattern on a bottom surface of the stacked structure of the plurality of base layers, and a third wiring pattern being between two neighboring ones of the plurality of base layers in a direction perpendicular to the PCB, an elastic modulus of the first wiring pattern being different from an elastic modulus of the second wiring pattern;
    a semiconductor chip attached to a surface of the PCB; and
    a mold layer covering at least a part of a top surface of the PCB and the semiconductor chip, wherein elastic moduli of the first wiring pattern, the second wiring pattern, and the third wiring pattern increase from the first wiring pattern to the third wiring pattern or from the third wiring pattern to the first wiring pattern.

16. The semiconductor package of claim 15, an average grain size of the first wiring pattern is greater than an average grain size of the second wiring pattern.

* * * * *